United States Patent
Narui et al.

(10) Patent No.: US 9,472,253 B2
(45) Date of Patent: Oct. 18, 2016

(54) SEMICONDUCTOR DEVICE INCLUDING SPIRAL DATA PATH

(71) Applicant: Micron Technology, Inc., Boise, ID (US)

(72) Inventors: Seiji Narui, Tokyo (JP); Chikara Kondo, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/607,858

(22) Filed: Jan. 28, 2015

(65) Prior Publication Data
US 2015/0213860 A1 Jul. 30, 2015

(30) Foreign Application Priority Data

Jan. 28, 2014 (JP) .................. 2014-013713

(51) Int. Cl.
*G11C 7/22* (2006.01)
*G11C 5/02* (2006.01)
*G11C 7/10* (2006.01)
*H01L 25/065* (2006.01)
*G11C 5/06* (2006.01)
*G11C 11/4097* (2006.01)

(52) U.S. Cl.
CPC . *G11C 7/22* (2013.01); *G11C 5/02* (2013.01); *G11C 5/063* (2013.01); *G11C 7/10* (2013.01); *H01L 25/0657* (2013.01); *G11C 11/4097* (2013.01); *H01L 2224/11* (2013.01); *H01L 2924/0002* (2013.01)

(58) Field of Classification Search
CPC ............ G11C 7/22; G11C 5/02; G11C 5/06; G11C 7/10; G11C 11/4097; H01L 25/0657; H01L 2224/11; H01L 2924/0002
See application file for complete search history.

(56) References Cited

U.S. PATENT DOCUMENTS

| | | | |
|---|---|---|---|
| 2011/0087811 A1 | 4/2011 | Kondo et al. | |
| 2011/0161748 A1* | 6/2011 | Casper | G11C 5/02 714/708 |
| 2012/0250387 A1 | 10/2012 | Kondo | |
| 2013/0021866 A1* | 1/2013 | Lee | H01L 25/0657 365/230.01 |
| 2013/0258788 A1 | 10/2013 | Ide et al. | |

\* cited by examiner

*Primary Examiner* — Richard Elms
*Assistant Examiner* — Ajay Ojha
(74) *Attorney, Agent, or Firm* — Dorsey & Whitney LLP

(57) ABSTRACT

A semiconductor device disclosed in this disclosure includes a first terminal formed above a first surface of a semiconductor substrate, a second terminal formed above a second surface of the semiconductor substrate opposite to the first surface, a first through substrate via (TSV) penetrating the semiconductor substrate, and a first-in first-out (FIFO) circuit, wherein the first TSV and the FIFO circuit are coupled in series between the first terminal and the second terminal.

16 Claims, 25 Drawing Sheets

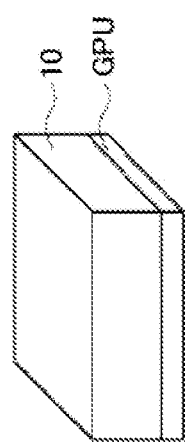

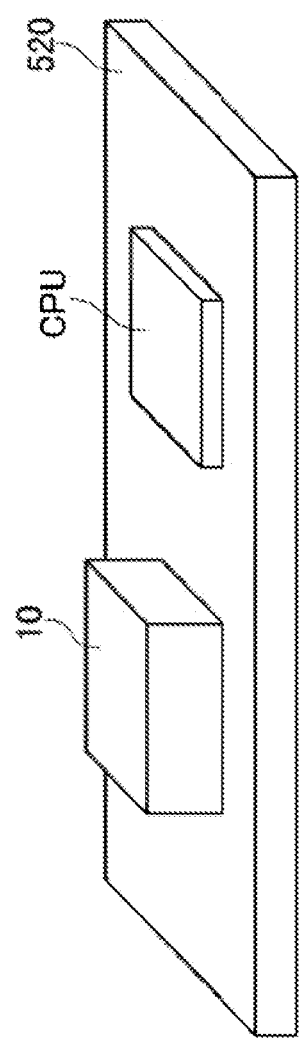

SEMICONDUCTOR DEVICE INCLUDING SPIRAL DATA PATH

This application is based upon and claims the benefit of priority from Japanese Patent Application No. 2014-013713 filed on Jan. 28, 2014, the disclosure of which are incorporated herein in its entirely by reference.

BACKGROUND

1. Field of Invention

Embodiments of the present invention relate to a semiconductor device and an information processing system, and particularly relates to a semiconductor device comprised of a plurality of stacked semiconductor chips and an information processing system.

2. Description of the Related Art

Recently, in order to increase the memory capacity per a package, a stacked-type semiconductor device, which is formed by integrating a front-end part and a back-end part of a DRAM (Dynamic Random Access Memory) in separate chips, respectively, and stacking them, has been proposed (see Japanese Patent Application Laid-Open No. 2012-216652 (corresponding US Patent Application Publication No. 2012/0250387 A1) (Patent Literature 1), Japanese Patent Application Laid-Open No. 2013-206255 (corresponding US Patent Application Publication No. 2013/0258788 A1) (Patent Literature 2), and Japanese Patent Application Laid-Open No. 2011-81885 (corresponding US Patent Application Publication No. 2011/0087811 A1) (Patent Literature 3). Note that these literatures are incorporated by reference.

According to such a stacked-type semiconductor device, since the occupied area that can be allocated to a memory core is increased in the core chips in which the back-end part is integrated, the memory capacity per a single core chip can be increased. On the other hand, since the interface chip in which the front-end part is integrated can be fabricated in a process different from that of the memory core, circuits thereof can be formed by high-speed transistors. Moreover, a plurality of core chips can be allocated to the single interface chip; therefore, a semiconductor device that is extremely high-capacity and high-speed as a whole can be provided.

In a stacked-type semiconductor device of this type, operation timing is sometimes different in each core chip due to process variations, voltage variations, etc. Therefore, there has been a problem that the timing margin of data transfer is reduced in transfer of read data from the core chip to the interface chip or transfer of write data from the interface chip to the core chip.

In consideration of this point, in the semiconductor devices described in Patent Literatures 2 and 3, buffer circuits for adjusting the output timing of read data and the receiving timing of write data are provided on each of core chips, thereby eliminating the lag in the timing of each of the core chips.

SUMMARY

According to a first aspect of the present invention, there is provided a semiconductor device including:
   first, second, third and fourth chips stacked in this order, each of the first, second, third and fourth chips including first, second, third and fourth terminals formed above a first surface thereof, a memory cell array, and a first in first out (FIFO) circuit;
   wherein each of the first, second and third chips includes fifth, sixth, seventh and eighth terminals formed above a second surface opposite to the first surface, the FIFO circuit coupled in series between the first terminal and the eighth terminal, the second terminal coupled to the fifth terminal, the third terminal coupled to the sixth terminal and the fourth terminal coupled to the seventh terminal.

According to another aspect of the present invention, there is provided a semiconductor device including:
   a first terminal formed above a first surface of a semiconductor substrate;
   a second terminal formed above a second surface of the semiconductor substrate opposite to the first surface;
   a first through substrate via (TSV) penetrating the semiconductor substrate; and
   a first-in first-out (FIFO) circuit;
   wherein the first TSV and the FIFO circuit are coupled in series between the first terminal and the second terminal.

Various embodiments of the present invention have a configuration in which buffer circuits provided in semiconductor chips are in cascade connection. Therefore, the parasitic capacities of signal paths used in data transfer are significantly reduced. Therefore, timing margins in data transfer can be increased compared with conventional cases.

BRIEF DESCRIPTION OF THE DRAWINGS

FIG. 24 is a schematic drawing showing a second example of the information processing system provided with the semiconductor device 10.

FIG. 25 is a schematic drawing showing a third example of the information processing system provided with the semiconductor device 10.

EMBODIMENTS

Hereinafter, embodiments of the present invention will be described in detail with reference to accompanying drawings.

Figure 1:
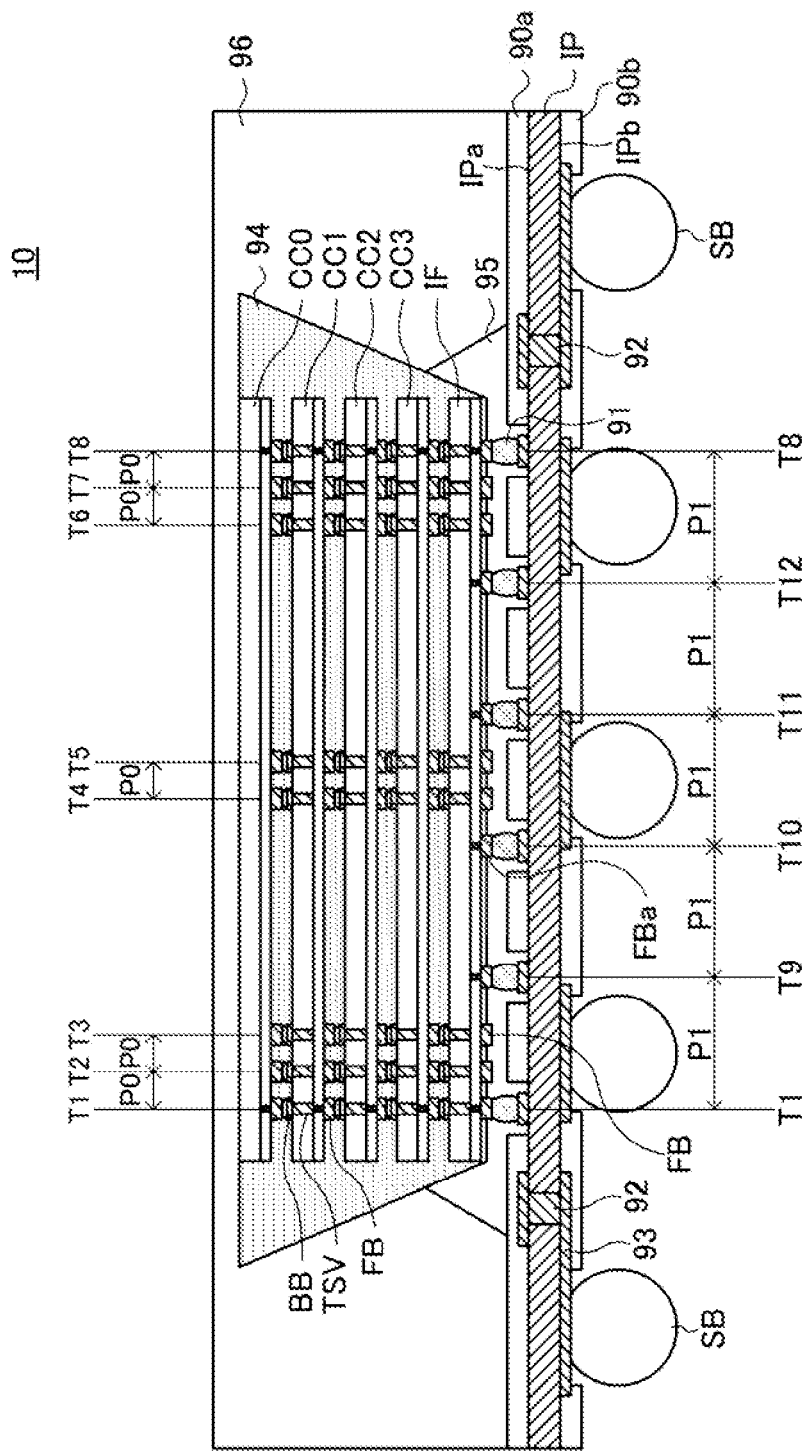
FIG. 1 is a schematic cross-sectional view illustrating the structure of a semiconductor device 10 according to an embodiment of the present invention.

FIG. 1 is a schematic cross-sectional view illustrating the structure of a semiconductor device 10 according to an embodiment of the present invention.

As shown in FIG. 1, the semiconductor device 10 according to the present embodiment has a structure in which four core chips CC0 to CC3 having mutually identical functions and may be fabricated using identical manufacturing masks, a single interface chip IF fabricated by using a manufacturing mask different from that for the core chips CC0 to CC3, and a single interposer IP are stacked. The core chips CC0 to CC3 and the interface chip IF are semiconductor chips using silicon substrates and are stacked on the interposer IP in a face-down method. The face-down method means a method in which a semiconductor chip is mounted so that a principal surface on which circuit elements such as transistors are formed is downward, in other words, the principal surface is directed toward the side of the interposer IP.

However, the semiconductor device according to embodiments of the present invention is not limited thereto, and the semiconductor chips may be stacked in a face-up method. The face-up method means a method in which the semiconductor chips are mounted so that the principal surface on which circuit elements such as transistors are formed is upward, in other words, the principal surface is directed toward the opposite side of the interposer IP. Furthermore, the semiconductor chip(s) stacked in the face-down method and the semiconductor chip(s) stacked in the face-up method may be mixed.

Many penetrating electrodes TSV (Through Substrate Via or Through Silicon Via) penetrating through the silicon substrates are provided in all of the core chips CC1 to CC3 and the interface chip IF except in the core chip CC0 positioned in the uppermost layer among these semiconductor chips. At the positions overlapped with the penetrating electrodes TSV in a planar view, which is viewed from the direction of stacking, front-surface bumps FB are provided in the principal surface side of the chips, and back-surface bumps BB are provided in the back-surface side of the chips. The back-surface bumps BB of the semiconductor chip positioned in a lower layer are joined with the front-surface bumps FB of the semiconductor chip positioned in an upper layer, thereby electrically connecting the semiconductor chips which are vertically adjacent to each other.

In the present embodiment, the reason why the core chip CC0 in the uppermost layer is not provided with the penetrating electrodes TSV is that there is no need to form bump electrodes on the back surface side of the core chip CC0 since the chips are stacked in the face-down method. In the case in which the core chip CC0 in the uppermost layer is not provided with the penetrating electrodes TSV in this manner, the thickness of the core chip CC0 in the uppermost layer can be increased more than those of the other core chips CC1 to CC3; therefore, the mechanical strength of the core chip CC0 can be increased. However, the core chip CC0 in the uppermost layer may be provided with the penetrating electrodes TSV. In that case, all of the core chips CC0 to CC3 can be fabricated by identical steps.

The core chips CC0 to CC3 are semiconductor chips from which front-end parts which carry out interfacing with outside have been removed among circuit blocks included in normal SDRAMs (synchronous Dynamic Random Access Memories). In other words, the core chips are the memory chips that include circuit blocks belonging to back-end parts. Examples of the circuit blocks included in the front-end part include a parallel/serial converting circuit, which carries out parallel/serial conversion between a memory cell array and a data input/output terminal, and a DLL (Delay Locked Loop) circuit, which controls input/output timing of data.

On the other hand, the interface chip IF is a semiconductor chip on which front-end parts are integrated among the circuit blocks included in a normal SDRAM. The interface chip IF functions as a front-end part shared by the four core chips CC0 to CC3. Therefore, all of the access from outside is carried out via the interface chip IF, and input/output of data is also carried out via the interface chip IF.

The interposer IP is a circuit board consisting of resin, and a plurality of external terminals (solder balls) SB are formed on a back surface IPb thereof. The interposer IP ensures mechanical strength of the semiconductor device 10 and functions as a rewiring substrate for increasing electrode pitches. More specifically, substrate electrodes 91 formed on an upper surface IPa of the interposer IP are extended to the back surface IPb by through-hole electrodes 92, and the pitches of the external terminals SB are increased by a rewiring layer 93 provided on the back surface IPb. The part of the upper surface IPa of the interposer IP on which the substrate electrodes 91 are not formed is covered with a resist 90a. The part of the back surface IPb of the interposer IP on which the external terminals SB are not formed is covered with a resist 90b. FIG. 1 shows five external terminals SB. However, in practice, more external terminals are provided. The layout of the external terminals SB may be the same as that of a SDRAM standard. Therefore, when viewed from an external controller, the semiconductor device 10 functions as a single SDRAM.

The gaps between the stacked core chips CC0 to CC3 and the interface chip IF are filled with an underfill 94, thereby ensuring mechanical strength. The gap between the interposer IP and the interface chip IF is filled with NCP (Non-Conductive Paste) 95. The whole package is coated with a mold resin 96. By virtue of this, the chips are physically protected.

The penetrating electrodes TSV provided in the core chips CC1 to CC3 and the interface chip IF are arranged at a processable minimum pitch or a pitch P0 somewhat wider than that in order to prevent increase in chip size. The value of the pitch P0 is, for example, about 40 to 50 μm. On the other hand, the substrate electrodes 91 provided on the interposer IP are arranged at a minimum pitch, which is allowed by the wiring rules of the interposer IP, or at a pitch P1 (>P0) somewhat wider than that. The value of the pitch P1 is, for example, about 75 to 150 μm. The pitches are not particularly limited, but are preferred to be P1=P0×2. FIG. 1 shows the eight penetrating electrodes TSV disposed in a row T1 to a row T8 in each of the core chips CC1 to CC3 and the interface chip IF and shows the six front-surface bumps FB disposed in a row T1 and a row T8 to a row T12 on the interface chip IF. However, in practice, more penetrating electrodes TSV and front-surface bumps FB are provided. As shown in FIG. 1, the front-surface bumps FB provided on the interface chip IF include the front-surface bumps FB that are joined with the substrate electrodes 91 on the interposer IP and the front-surface bumps FB that are not joined with the substrate electrodes 91 on the interposer IP.

Some of the penetrating electrodes TSV provided in the core chips CC1 to CC3 are connected to the front-surface bumps FB and the back-surface bumps BB provided at the same positions in a planar view. In the present embodiment, the penetrating electrodes TSV of this type are sometimes described as penetrating electrodes TSV1. All of the penetrating electrodes TSV belonging to the row T1 and the row T8 shown in FIG. 1 are the penetrating electrodes TSV1.

On the other hand, the other penetrating electrodes TSV provided in the core chips CC1 to CC3 are connected to the back-surface bumps BB, which are provided at the same positions in the planar view, but are not connected to the front-surface bumps FB, which are provided at the same positions in the planar view. In the present embodiment, the penetrating electrodes TSV of this type are sometimes described as penetrating electrodes TSV2. In FIG. 1, among the plurality of penetrating electrodes TSV provided in the core chips CC1 to CC3, the penetrating electrodes of the row T2 to the row T7 are the penetrating electrodes TSV2.

Most of the penetrating electrodes TSV provided in the interface chip IF are also the penetrating electrodes TSV2 which are connected to the back-surface bumps BB, which are provided at the same positions in the planar view, but are not connected to the front-surface bumps FB, which are provided at the same positions in the planar view. In FIG. 1, among the plurality of penetrating electrodes TSV provided in the interface chip IF, the penetrating electrodes of the row T2 to the row T7 are the penetrating electrodes TSV2.

Figure 2:
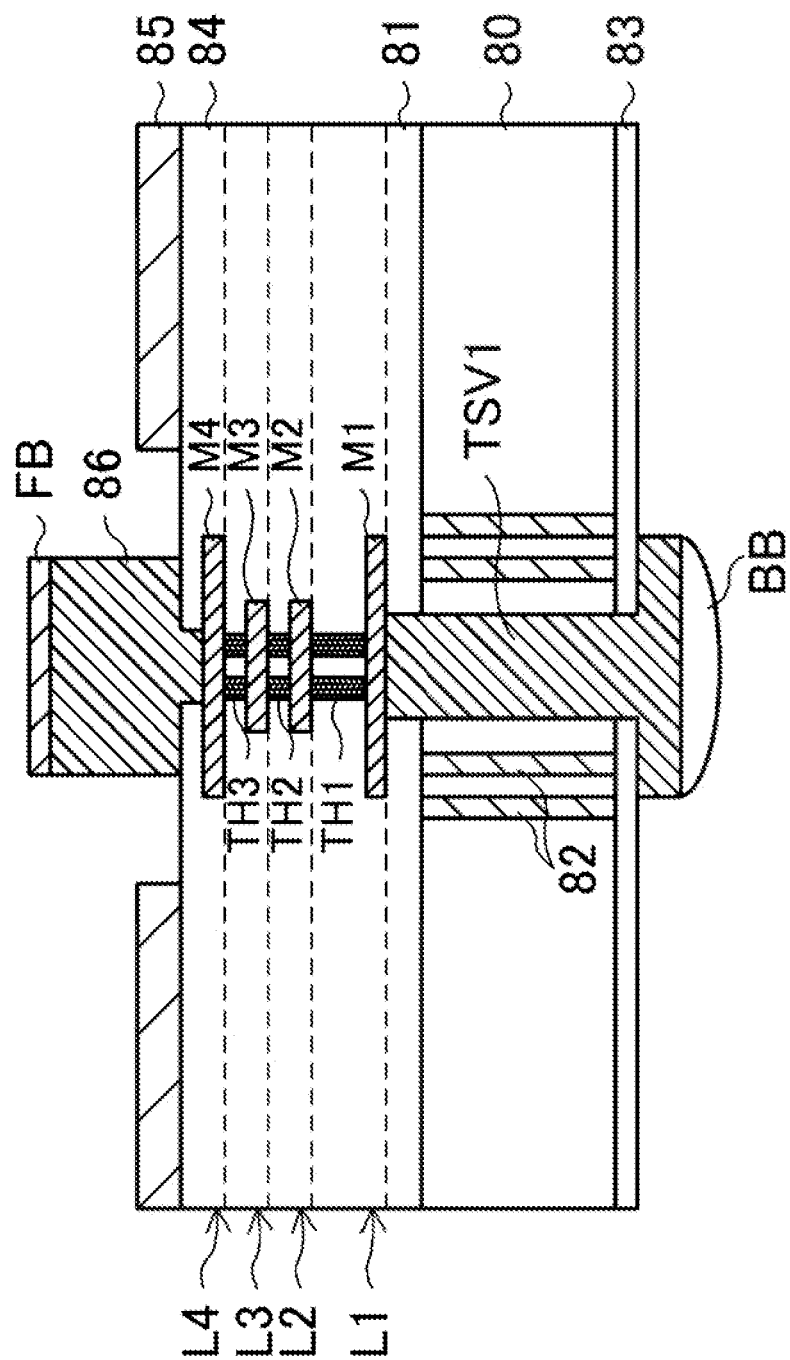
FIG. 2 is a cross-sectional view showing the structure of a penetrating electrode TSV.
Figure 3:
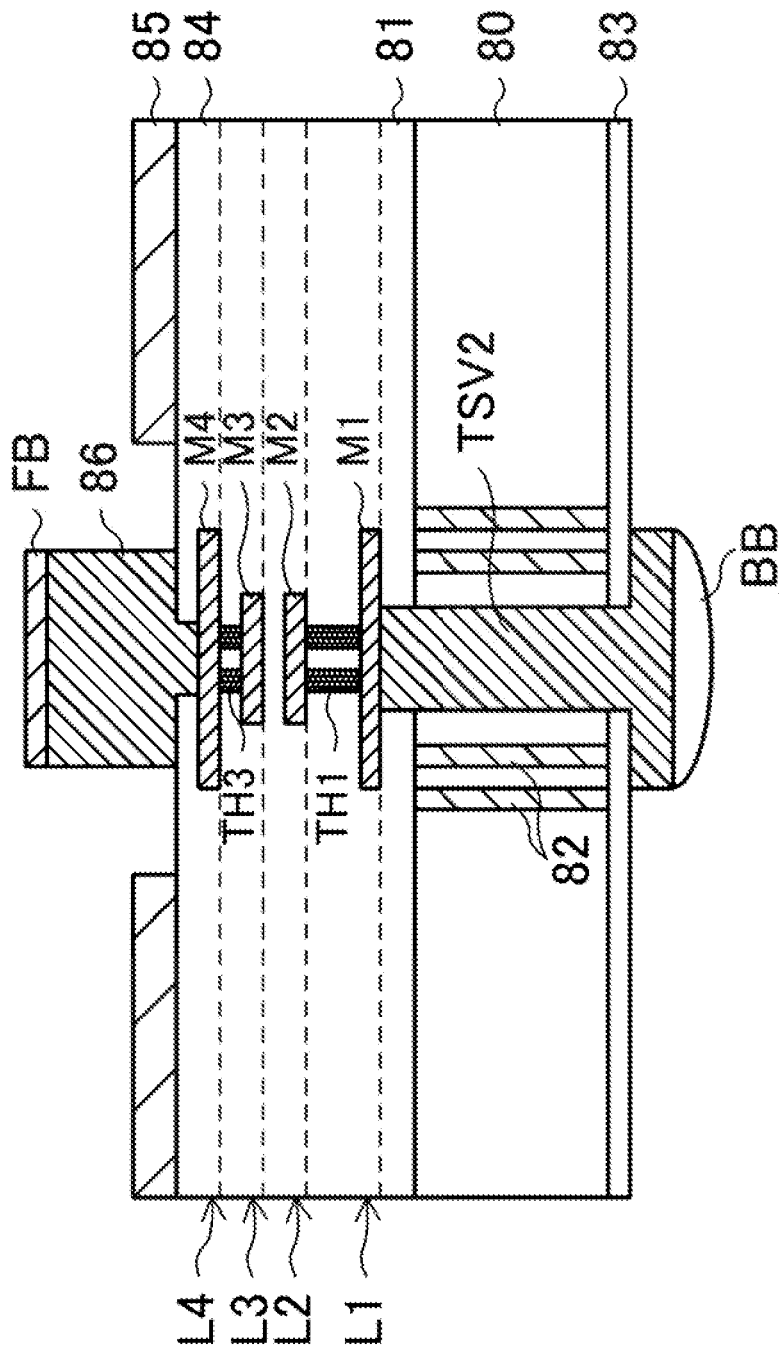
FIG. 3 is a cross-sectional view showing the structure of a penetrating electrode TSV.

FIG. 2 and FIG. 3 are cross-sectional views showing the structures of the penetrating electrodes TSV1 and TSV2, respectively.

As shown in FIG. 2, the penetrating electrode TSV1 is provided to penetrate through the silicon substrate 80, an interlayer insulating film 81, which is provided on a front surface of the silicon substrate 80, and a passivation film 83, which is provided on a back surface of the silicon substrate 80. The penetrating electrode TSV1 is not particularly limited to, but is formed of Cu (copper). The front surface (the upper-side surface in FIG. 2) of the silicon substrate 80 is a device formation surface on which devices such as transistors are formed. Insulating rings 82 are provided around the penetrating electrode TSV1, thereby ensuring insulation between the penetrating electrode TSV1 and the transistor region. In the example shown in FIG. 2, the insulating rings 82 are doubly provided, thereby reducing the electrostatic capacity between the penetrating electrode TSV1 and the silicon substrate 80. The insulating rings 82 may be single instead of being double.

An end part of the penetrating electrode TSV1 in the back surface side of the silicon substrate 80 is covered with the back-surface bump BB. As shown in FIG. 1, the back-surface bumps BB are in contact with the front-surface bumps FB, which are provided on the core chips CC0 to CC2 in the upper layers thereof, at the core chips CC1 to CC3 and are in contact with the front-surface bumps FB, which are provided on the core chip CC3, at the interface chip IF. The back-surface bumps BB are not particularly limited to, but are formed of SnAg solder covering the surface of the penetrating electrodes TSV1.

Insulating layers corresponding to five layers including the above described interlayer insulating film 81 are formed on the front surface of the silicon substrate 80. The uppermost layer thereof is a passivation film 84. On the front surfaces of the layers excluding the passivation film 84, wiring layers L1 to L4 are sequentially formed from the side that is closer to the front surface of the silicon substrate 80. The wiring layers L1 to L4 are comprised of pads M1 to M4, respectively. Among them, the pad M1 is in contact with the end part of the penetrating electrode TSV1 that is in the front surface side of the silicon substrate 80. In the layers excluding the interlayer insulating film 81 and the passivation film 84, a plurality of through-hole electrodes TH1 to TH3 are provided sequentially from the side that is close to the front surface of the silicon substrate 80, thereby mutually connecting the pads M1 to M4.

The front-surface bump FB is connected to the pad M4 via a pillar part 86, which is penetrating through the passivation film 84. Therefore, the front-surface bump FB is connected to the end part of the penetrating electrode TSV1 via the pillar part 86, the pads M1 to M4, and the through-hole electrodes TH1 to TH3. As shown in FIG. 1, at the core chips CC1 to CC3, the front-surface bumps FB are in contact with the back-surface bumps BB, which are provided on the core chips CC2 and CC3 and the interface chip IF in the lower layers thereof; and, at the interface chip IF, the front-surface bumps FB are in contact with the substrate electrode 91 on the interposer IP. The front-surface bump FB is not particularly limited, but has the pillar part 86 formed of Cu (copper). The surface of the pillar part 86 has a stacked structure of Ni (nickel) and Au (gold). The diameters of the front-surface bumps FB and the back-surface bumps BB are about 20 μm.

The front surface of the passivation film 84 is covered with a polyimide film 85 excluding the region in which the front-surface bump FB is formed. The connection with internal circuits not shown is established via internal wiring (not shown) extended from the pads M1 to M3 provided in the wiring layers L1 to L3.

In this manner, the penetrating electrode TSV1 is connected to the front-surface bump FB and the back-surface bump BB provided at the same position of the same chip in the planar view. Since the penetrating electrodes TSV1 are commonly connected to the chips, the penetrating electrodes TSV1 are used as, for example, power-supply paths.

On the other hand, as shown in FIG. 3, the penetrating electrode TSV2 is not provided with the through-hole electrode TH2, which connects the pad M2 and the pad M3 at the same planar position. Therefore, the front-surface bump FB and the back-surface bump BB at the same planar position are not short-circuited with each other. Regarding the other points, the penetrating electrode TSV2 and the penetrating electrode TSV1 have the same structure.

The penetrating electrodes TSV2 are cyclically connected so that they are used, for example, in a case in which the interface chip IF and the core chips CC0 to CC3 are individually connected.

Figure 4:
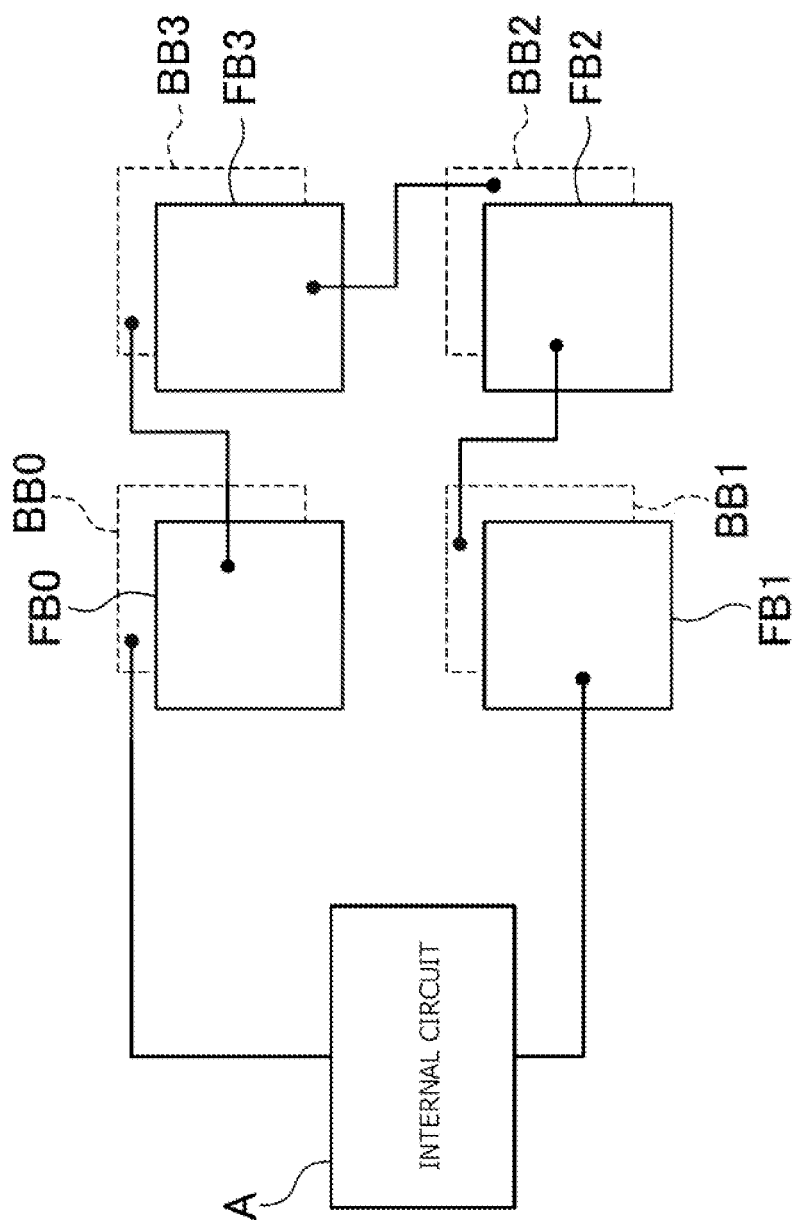
FIG. 4 is a plan view showing an example in which four penetrating electrodes TSV2 are cyclically connected per one chip.

FIG. 4 is a plan view showing an example of cyclic connection of the four penetrating electrodes TSV2 per one chip.

In FIG. 4, the front-surface bumps FB are shown by solid lines, and the back-surface bumps BB are shown by broken lines. As shown in FIG. 4, when the penetrating electrodes TSV2 are cyclically connected, individual information can be fed from the interface chip IF to the core chips CC0 to CC3 while the circuit configurations of the core chips CC0 to CC3 are caused to be mutually the same. For example, if an internal circuit A is connected between a back-surface bump BB0 and a front-surface bump FB1, the signals supplied from the interface chip IF to the back-surface bumps BB0 to BB3 of the core chip CC3 of the lowermost layer are selectively supplied to the internal circuits A of the core chips CC0 to CC3.

Such cyclic connection is sometimes referred to as "spiral connection" in the present specification. The spiral connection is not particularly limited, but can be used as signal paths of read/write data.

Next, the circuit configurations of the interface chip IF and the core chips CC0 to CC3 will be described.

Figure 5:
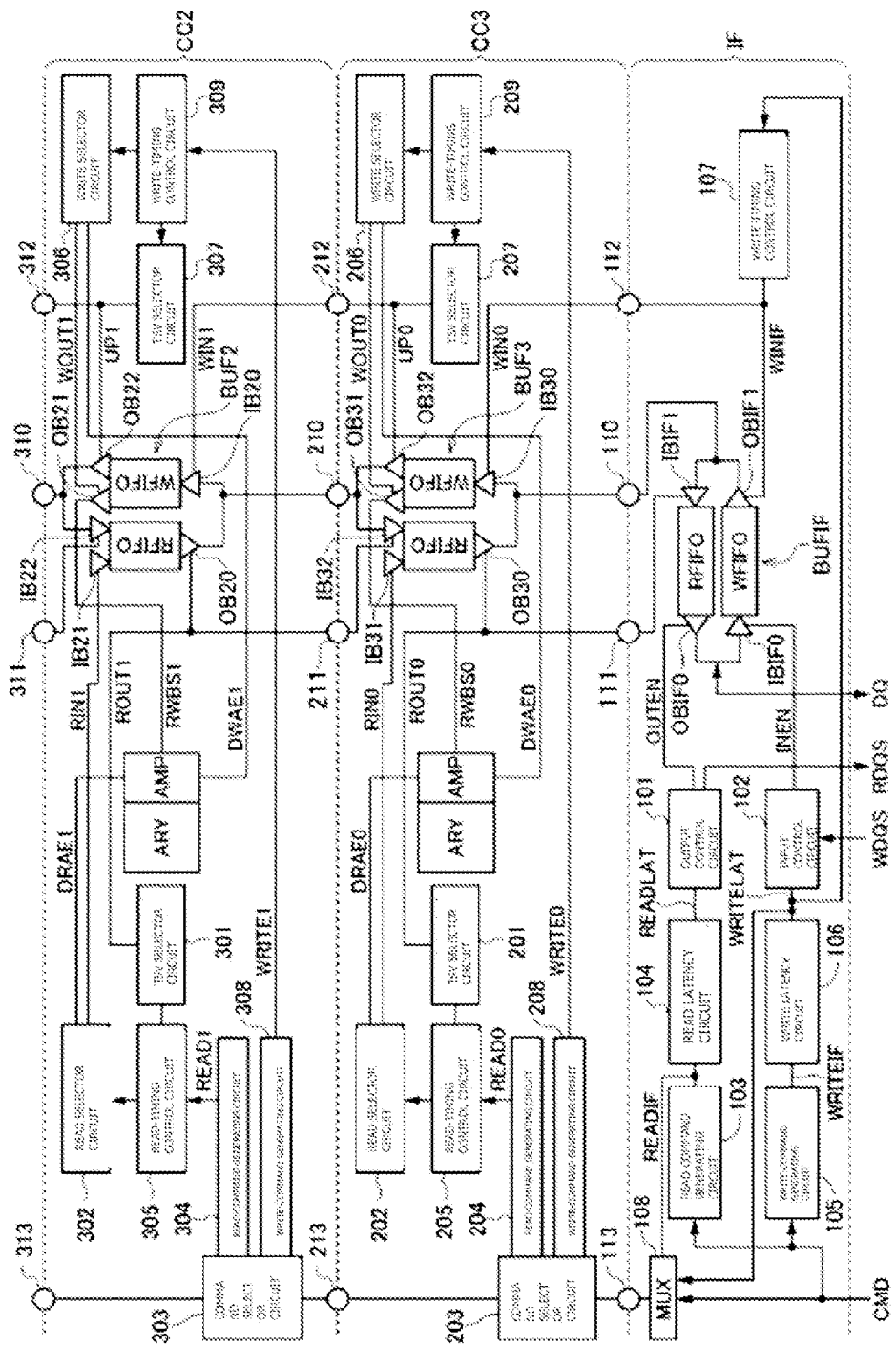
FIG. 5 is a block diagram illustrating the circuit configuration of an interface chip IF and core chips CC0 to CC3.

FIG. 5 is a block diagram illustrating the circuit configurations of the interface chip IF and the core chips CC0 to CC3. Since the core chips CC0 to CC3 basically have the same circuit configurations, illustration of the circuit configurations of the core chips CC0 and CC1 is omitted in FIG. 5. Hereinafter, the core chips CC0 to CC3 are sometimes simply generally referred to as "core chips CC" in the case in which they are not particularly distinguished.

As shown in FIG. 5, the interface chip IF and the core chips CC are provided with buffer circuits, which buffer read data and write data. Specifically, the interface chip IF is provided with a buffer circuit BUFIF, and the core chips CC2 and CC3 are provided with buffer circuits BUF2 and BUF3, respectively. Although not shown in the drawings, the core chips CC0 and CC1 are also provided with buffer circuits BUF0 and BUF1, respectively. Hereinafter, the buffer circuits BUFIF and BUF0 to BUF3 are sometimes simply generally referred to as "buffer circuits BUF" in the case in which they are not particularly distinguished.

Each of the buffer circuits BUF is provided with a read buffer circuit RFIFO and a write buffer circuit WFIFO, input buffers are provided at input terminals thereof, and output buffers are provided at output terminals thereof. All of the read buffer circuits RFIFO and the write buffer circuits WFIFO are FIFO circuits having a first-in/first-out function.

In more detailed explanation, the output terminal of the read buffer circuit RFIFO provided on the interface chip IF is connected to a data input/output terminal DQ via an output buffer OBIF0. The output buffer OBIF0 is activated based on a timing signal OUTEN, which is generated by an output control circuit 101. Also, the input terminal of the write buffer circuit WFIF provided on the interface chip IF is connected to a data input/output terminal DQ via an input buffer IBIF0. The input buffer IBIF0 is activated based on a timing signal INEN, which is generated by an input control circuit 102.

The output control circuit 101 is activated based on a read command, which is supplied via a command terminal CMD. When the read command is supplied to the command terminal CMD, a read signal READIF is activated by a read-command generating circuit 103. The read signal READIF is delayed via a read latency circuit 104 and is supplied to the output control circuit 101 as a read signal READLAT. Therefore, if a read command is issued from outside, after predetermined delay time defined by the read latency circuit 104 elapses, the output buffer OBIF0 is activated, and read data is output from the data input/output terminal DQ.

The input control circuit 102 is activated based on a write command, which is supplied via the command terminal CMD. When a write command is supplied to the command terminal CMD, a write signal WRITEIF is activated by a write-command generating circuit 105. The write signal WRITEIF is delayed via a write latency circuit 106 and is supplied to the input control circuit 102 as a write signal WRITELAT. Therefore, when a write command is issued from outside, after predetermined delay time defined by the write latency circuit 106 elapses, the input buffer IBIF0 is activated, and write data input from outside is retrieved to the write buffer circuit WFIFO.

The input terminal of the read buffer circuit RFIFO provided on the interface chip IF is connected to a penetrating electrode 110 via an input buffer IBIF1. The penetrating electrode 110 is provided in the interface chip IF and is connected to the buffer circuit BUF3 included in the core chip CC3 in the upper layer thereof. The input buffer IBIF1 is activated based on a timing signal ROUT0, which is generated by a TSV selector circuit 201 of the core chip CC3. The timing signal ROUT0 is supplied to the interface chip IF via a penetrating electrode 111.

Furthermore, the output terminal of the write buffer circuit WFIFO provided on the interface chip IF is connected to the penetrating electrode 110 via an output buffer OBIF1. The output buffer OBIF1 is activated based on a timing signal WINIF, which is generated by a write-timing control circuit 107.

Operation of the write-timing control circuit 107 is controlled by the write signal WRITELAT. When the write signal WRITELAT is activated, the write-timing control circuit 107 activates the timing signal WINIF at predetermined timing. The timing signal WINIF is supplied to the core chip CC3 via a penetrating electrode 112 and activates an input buffer IB30 as a timing signal WIN0.

The interface chip IF also includes a multiplexer 108. Based on the read signal READIF, the multiplexer 108 outputs either one of the command, which is supplied to the command terminal CMD, and the write signal WRITELAT to a penetrating electrode 113. The penetrating electrode 113 is connected to a command selector 203, which is provided on the core chip CC3.

The circuit configuration of the interface chip IF has been described above. Next, the circuit configuration of the core chip CC will be described.

As shown in FIG. 5, the core chip CC is provided with a memory cell array ARY, which stores data. The data read from the memory cell array ARY is output via an amplifier circuit AMP, and the data to be written to the memory cell array ARY is input via the amplifier circuit AMP.

Herein, a buffer circuit BUF3 provided on the core chip CC3 will be described. The buffer circuit BUF3 includes a read buffer circuit RFIFO and a write buffer circuit WFIFO. The output terminal of the read buffer circuit RFIFO is connected to the penetrating electrode 110 via an output buffer OB30. The output buffer OB30 is activated based on a timing signal ROUT0, which is generated by a TSV selector circuit 201. The input terminal of the write buffer circuit WFIFO is connected to the penetrating electrode 110 via the input buffer IB30. The input buffer IB30 is activated based on the timing signal WIN0, which is generated by the write-timing control circuit 107 in the interface chip IF.

Moreover, exclusively activated two input buffers IB31 and IB32 are connected to the input terminal of the read buffer circuit RFIFO, which is provided on the core chip CC3. The input buffer IB31 is connected to the amplifier circuit AMP via a read/write bus RWBS0, and the input buffer IB32 is connected to a penetrating electrode 210. The penetrating electrode 210 is provided in the core chip CC3 and is connected to the buffer circuit BUF2, which is included in the core chip CC2 in the upper layer thereof.

The input buffer IB31 is activated based on a timing signal RIN0, which is generated by a read selector circuit 202. The input buffer IB32 is activated based on a timing signal ROUT1, which is generated by a TSV selector circuit 301 of the core chip CC2. The timing signal ROUT1 is supplied to the core chip CC3 via a penetrating electrode 211.

The TSV selector circuit 201 and the read selector circuit 202 are controlled by a read command, which is supplied via the penetrating electrode 113. When the read command is supplied via the penetrating electrode 113, the command selector 203 supplies the read command to a read-command generating circuit 204, and, in response to this, the read-command generating circuit 204 generates a read signal READ0. The read signal READ0 is supplied to a read-timing control circuit 205. When the read-timing control circuit 205 receives the read signal READ0, the read-timing control circuit 205 controls the TSV selector circuit 201 and the read selector circuit 202 at predetermined timing.

Herein, while the TSV selector circuit 201 is always activated in response to the read signal READ0, whether the read selector circuit 202 is activated or not depends on an address signal. Specifically, if an address signal corresponding to the read command is specifying the core chip CC3, the read selector circuit 202 drives the amplifier circuit AMP by activating a read enable signal DRAE0 at predetermined timing and then establishes conduction of the input buffer IB31 by activating the timing signal RIN0. As a result, the data read from the memory cell array ARY of the core chip CC3 is supplied to the read buffer circuit RFIFO via the amplifier circuit AMP and the input buffer IB31.

On the other hand, if the address signal corresponding to the read command is not specifying the core chip CC3, the read selector circuit 202 maintains the read enable signal DRAE0 and the timing signal RIN0 in an inactive state. As a result, data is not read from the memory cell array ARY of the core chip CC3.

Then, the read data accumulated in the read buffer circuit RFIFO of the core chip CC3 is supplied to the penetrating electrode 110 in response to the timing signal ROUT0 and is transferred to the read buffer circuit RFIFO in the interface chip IF via the input buffer IBIF1.

Furthermore, exclusively activated two output buffers OB31 and OB32 are connected to the output terminal of the write buffer circuit WFIFO, which is provided on the core chip CC3. The output buffer OB31 is connected to the amplifier circuit AMP via a read/write bus RWBS0, and the output buffer OB32 is connected to the penetrating electrode 210.

The output buffer OB31 is activated based on a timing signal WOUT0, which is generated by a write selector circuit 206. The output buffer OB32 is activated based on a timing signal UP0, which is generated by a TSV selector circuit 207. The timing signal UP0 is supplied to the core chip CC2 via a penetrating electrode 212 and is supplied to an input buffer IB20 as a timing signal WIN1.

The TSV selector circuit 207 and the write selector circuit 206 are controlled by a write command, which is supplied via the penetrating electrode 113. When the write command is supplied via the penetrating electrode 113, the command selector 203 supplies the write command to a write-command generating circuit 208, and, in response to this, the write-command generating circuit 208 generates a write signal WRITE0. The write signal WRITE0 is supplied to a write-timing control circuit 209. When the write-timing control circuit 209 receives the write signal WRITE0, the write-timing control circuit 209 controls the TSV selector circuit 207 and the write selector circuit 206 at predetermined timing.

Herein, whether the write selector circuit 206 is activated or not depends on an address signal. Specifically, if the address signal corresponding to the write command is specifying the core chip CC3, the write selector circuit 206 establishes conduction of the output buffer OB31 by activating the timing signal WOUT0 at predetermined timing. Then, the amplifier circuit AMP is driven by activating a write enable signal DWAE0. As a result, the data accumulated in the write buffer circuit WFIFO is written to the memory cell array ARY via the output buffer OB31 and the amplifier circuit AMP.

On the other hand, if the address signal corresponding to the write command is not specifying the core chip CC3, the write selector circuit 206 maintains the write enable signal DWAE0 and the timing signal ROUT0 in an inactive state. As a result, data is not written to the memory cell array ARY of the core chip CC3. Instead of that, the TSV selector circuit 207 activates a timing signal UP, and the data accumulated in the write buffer circuit WFIFO is output to the penetrating electrode 210 via the output buffer OB32.

As described above, the timing signal UP0 is supplied to the core chip CC2 via the penetrating electrode 212 and is supplied to the input buffer IB20 as the timing signal WIN1. Therefore, the data transferred from the core chip CC3 to the core chip CC2 via the penetrating electrode 210 is written to the write buffer circuit WFIFO in the core chip CC2 via the input buffer IB20.

The circuit configuration of the core chip CC3 has been described above. Since the other core chips CC0 to CC2 also have the circuit configurations which are similar to that of the above described core chip CC3, redundant explanations will be omitted.

Then, for example, when a read command specifying the core chip CC2 is issued, a read selector circuit 302 included in the core chip CC2 drives the amplifier circuit AMP by activating a read enable signal DRAE1 at predetermined timing and then establishes conduction of an input buffer IB21 by activating a timing signal RIN1. As a result, the data read from the memory cell array ARY of the core chip CC2 is supplied to the read buffer circuit RFIFO via the amplifier circuit AMP and the input buffer IB21.

The data accumulated in the read buffer circuit RFIFO of the core chip CC2 is transferred to the read buffer circuit RFIFO of the core chip CC3 via an output buffer OB20, the penetrating electrode 210, and the input buffer IB32. Then, the data transferred to the read buffer circuit RFIFO of the core chip CC3 is transferred to the read buffer circuit RFIFO of the interface chip IF via the output buffer OB30, the penetrating electrode 110, and the input buffer IBIF1.

On the other hand, for example, if a write command specifying the core chip CC2 is issued, a write selector circuit 306 included in the core chip CC2 establishes conduction of an output buffer OB21 by activating a timing signal WOUT1 at predetermined timing. Then, the amplifier circuit AMP is driven by activating a write enable signal DWAE1. As a result, the data accumulated in the write buffer circuit WFIFO is written to the memory cell array ARY via the output buffer OB21 and the amplifier circuit AMP.

The circuit configuration of the semiconductor device 10 according to the present embodiment has been described above. Next, operation of the semiconductor device 10 according to the present embodiment will be described.

Figure 6:
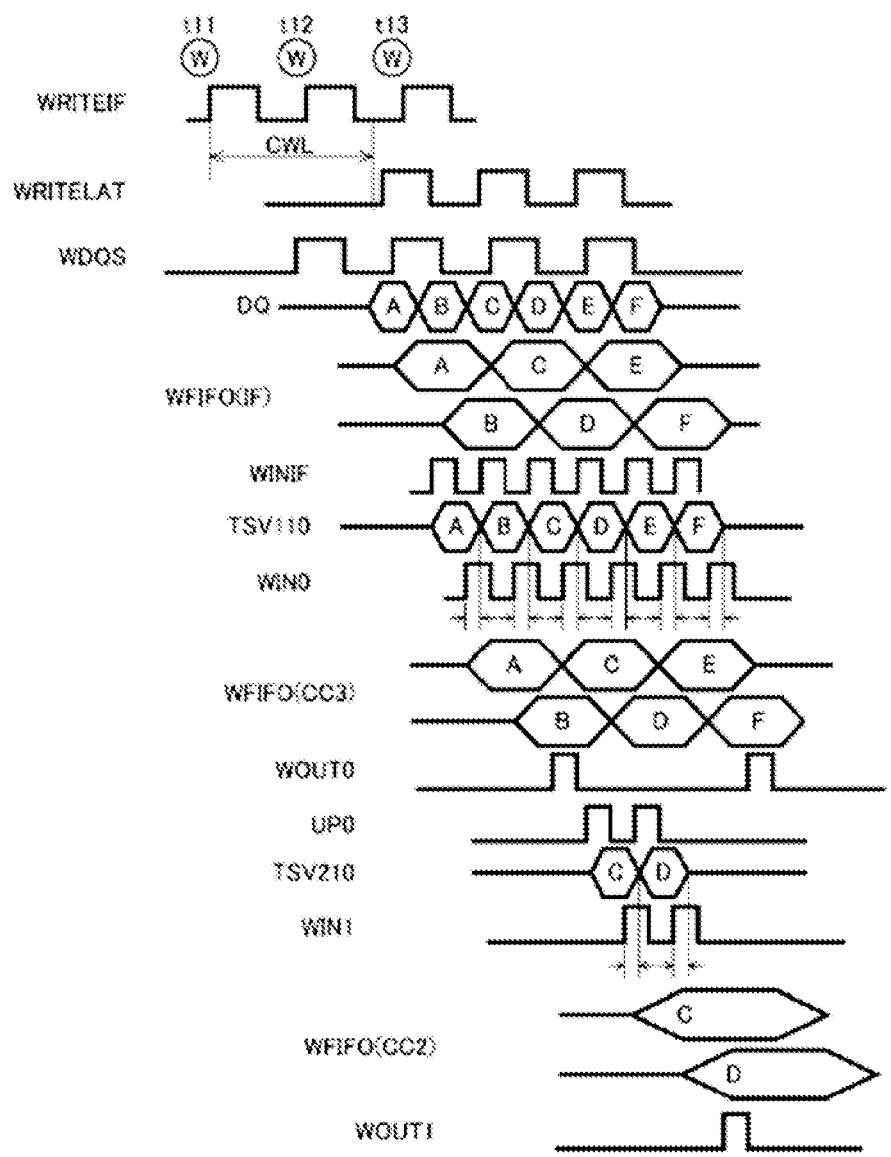
FIG. 6 is a timing chart illustrating a write operation of the semiconductor device 10.

FIG. 6 is a timing chart illustrating a write operation of the semiconductor device 10 according to the present embodiment.

In the example shown in FIG. 6, write commands (W) are continuously input three times. Among them, the write commands input at time t11 and t13 are the write commands specifying the core chip CC3, and the write command input at time t12 is a write command specifying the core chip CC2.

First, every time the write command is input, the write signal WRITEIF is activated by the write-command generating circuit 105 in the interface chip IF. Furthermore, the write signal WRITEIF is delayed by the write latency circuit 106, and the write signal WRITELAT is generated. The amount delayed by the write latency circuit 106 is defined by CAS write latency CWL.

When the write signal WRITELAT is generated, the input control circuit 102 is activated. When the input control circuit 102 is activated, the input buffer IBIF0 is activated in response to a strobe signal input from a strobe terminal WDQS. As a result, write data A to F, which undergoes burst input via the data input/output terminal DQ, is accumulated in this order in the write buffer circuit WFIFO.

In synchronization with this operation, the timing signal WINIF is activated by the write-timing control circuit 107. The timing signal WINIF activates the output buffer OBIF1, is supplied to the core chip CC3 via the penetrating electrode 112, and activates the input buffer IB30 as the timing signal WIN0.

As a result, the write data A to F is transferred via the penetrating electrode 110, and the write data A to F is sequentially accumulated in the write buffer circuit WFIFO of the core chip CC3. This operation is a transfer operation from the interface chip IF to the core chip CC3, which are adjacent to each other, and the timing control thereof is carried out by the interface chip IF; therefore, a sufficient timing margin can be ensured. Moreover, since the penetrating electrode 110 is separated from the other penetrating electrodes (for example, the penetrating electrode 210), the parasitic capacity of this signal path is small.

Then, when the write data A and B is accumulated in the write buffer circuit WFIFO of the core chip CC3, the timing signal WOUT0 is activated. As a result, the write data A and B is parallelly read from the write buffer circuit WFIFO and is parallelly written to the memory cell array ARY of the core chip CC3 via the amplifier circuit AMP.

Then, when the write data C and D is accumulated in the write buffer circuit WFIFO of the core chip CC3, the timing signal UP0 is activated. As a result, the write data C and D is serially read from the write buffer circuit WFIFO and is transferred to the core chip CC2 via the penetrating electrode 210. The write data C and D transferred to the core chip CC2 is sequentially accumulated in the write buffer circuit WFIFO of the core chip CC2 in response to the timing signal WIN1.

In this manner, the write data C and D is transferred via the penetrating electrode 210, and the write data C and D is sequentially accumulated in the write buffer circuit WFIFO of the core chip CC2. This operation is a transfer operation from the core chip CC3 to the core chip CC2, which are adjacent to each other, and the timing control thereof is carried out by the core chip CC3; therefore, a sufficient timing margin can be ensured. Moreover, since the penetrating electrode 210 is separated from the other penetrating electrodes (for example, the penetrating electrode 110), the parasitic capacity of the signal path is small.

Then, when the write data C and D is accumulated in the write buffer circuit WFIFO of the core chip CC2, the timing signal WOUT1 is activated. As a result, the write data C and D is parallelly read from the write buffer circuit WFIFO and is parallelly written to the memory cell array ARY of the core chip CC2 via the amplifier circuit AMP.

Furthermore, when the write data E and F is accumulated in the write buffer circuit WFIFO of the core chip CC3, the timing signal WOUT0 is activated again. As a result, the write data E and F is parallelly read from the write buffer circuit WFIFO and is parallelly written to the memory cell array ARY of the core chip CC3 via the amplifier circuit AMP.

In this manner, in the write operation, the write data is sequentially transferred from the core chip in the lower layer, and the retrieving timing of the write data in a certain core chip is controlled by the core chip which is in the layer immediately therebelow. Moreover, the parasitic capacity of the signal path used in the transfer of the write data is small. As a result, even in a case in which write data is transferred at high speed, a sufficient timing margin can be ensured.

Figure 7:
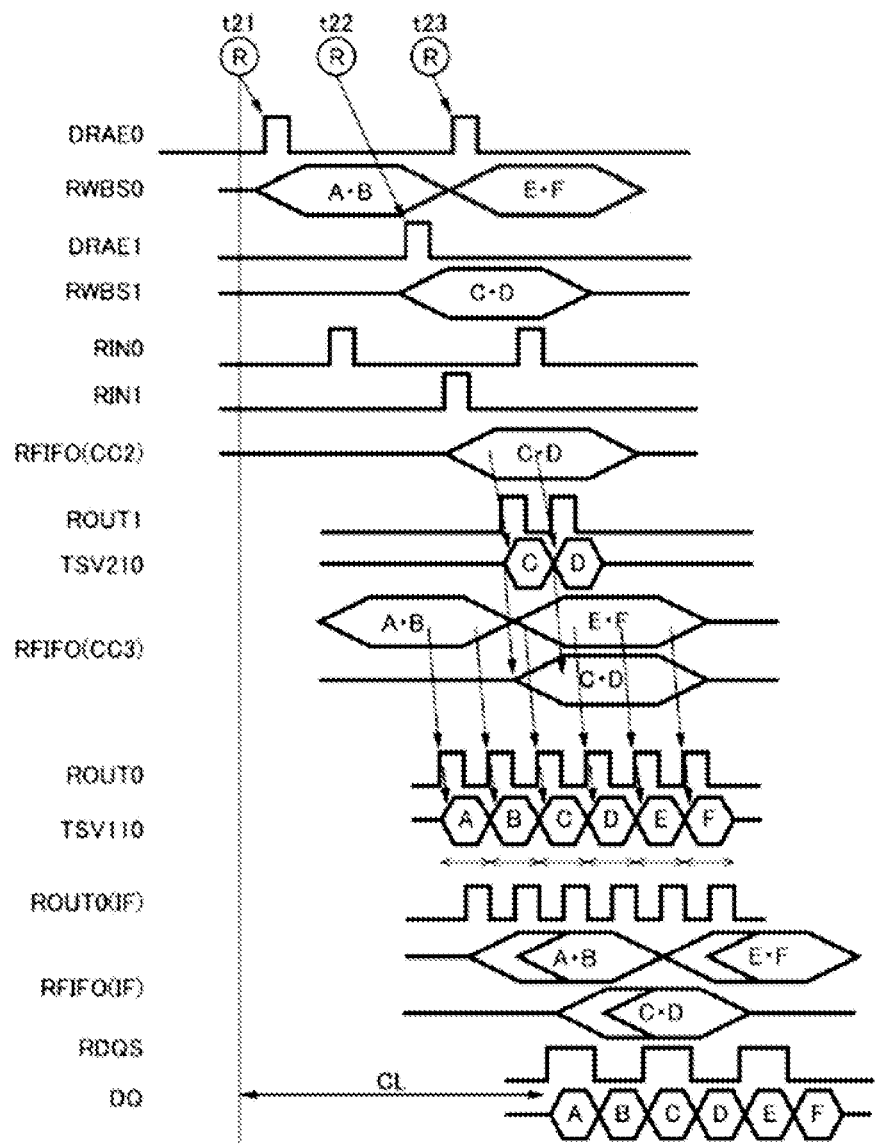
FIG. 7 is a timing chart illustrating a read operation of the semiconductor device 10.

FIG. 7 is a timing chart illustrating a read operation of the semiconductor device 10 according to the present embodiment.

In the example shown in FIG. 7, read commands (R) are continuously input three times. Among them, the read commands input at time t21 and t23 are the read commands specifying the core chip CC3, and the read command input at time t22 is a read command specifying the core chip CC2.

First, every time the read commands are input at the time t21 and t23, the read enable signal DRAE0 is activated by the read selector circuit 202 in the core chip CC3. On the other hand, when the read command is input at the time t22, the read enable signal DRAE1 is activated by the read selector circuit 302 in the core chip CC2.

When the read enable signal DRAE0 is activated, the amplifier circuit AMP in the core chip CC3 is activated, and parallel read data read from the memory cell array ARY is supplied to the buffer circuit BUF3. Similarly, when the read enable signal DRAE1 is activated, the amplifier circuit AMP in the core chip CC2 is activated, and parallel read data read from the memory cell array ARY is supplied to the buffer circuit BUF2.

When the read data A and B is supplied to the buffer circuit BUF3 in the core chip CC3, the read selector circuit 202 activates the timing signal RIN0. As a result, the read data A and B is accumulated in the read buffer circuit RFIFO of the core chip CC3.

Then, when the read data C and D is supplied to the buffer circuit BUF2 in the core chip CC2, the read selector circuit 302 activates the timing signal RIN1. As a result, the read data C and D is accumulated in the read buffer circuit RFIFO of the core chip CC2.

Furthermore, when the read data E and F is supplied to the buffer circuit BUF3 in the core chip CC3, the read selector circuit 202 activates the timing signal RIN0. As a result, the read data E and F is accumulated in the read buffer circuit RFIFO of the core chip CC3.

In the above described manner, the read data A, B, E, and F is accumulated in the write buffer circuit WFIFO of the core chip CC3, and the read buffer circuit RFIFO of the core chip CC2 becomes a state in which the read data C and D is accumulated therein.

Then, the TSV selector circuit 201 of the core chip CC3 continuously activates the timing signal ROUT0 to sequentially serially transfer the read data, which is accumulated in the read buffer circuit RFIFO, to the interface chip IF. In this process, when the read data C and D is accumulated in the read buffer circuit RFIFO of the core chip CC2, the TSV selector circuit 301 of the core chip CC2 activates the timing signal ROUT1 two times. As a result, the read data C and D accumulated in the read buffer circuit RFIFO of the core chip CC2 is serially read and is transferred to the core chip CC3 via the penetrating electrode 210.

As a result, the read buffer circuit RFIFO of the core chip CC3 can transfer the read data A to F to the interface chip IF in this order. Then, after predetermined delay time elapses after issue of the read commands, the read data A to F accumulated in the read buffer circuit RFIFO of the interface chip IF is subjected to a burst-output together with a strobe signal RDQS under control by the output control circuit 101. The amount of delay by the read latency circuit 104 in the read operation is defined by the CAS latency CL.

In this manner, in the read operation, the read data is sequentially transferred from the core chips in the upper layers, and the retrieving timing of the read data in a certain core chip is controlled by the core chip in the layer immediately thereabove. Moreover, the parasitic capacity of the signal path used in transfer of the read data is small. By virtue of this, even in a case in which the read data is transferred at high speed, a sufficient timing margin can be ensured.

FIG. 8 to FIG. 11 are schematic drawings illustrating the operations of the buffer circuits BUF in the case in which the core chips CC3 to CC0 are accessed.

As shown in FIG. 8 to FIG. 11, each of the buffer circuits BUF can be considered to have three data terminals. Specifically, the buffer circuit BUF3 of the core chip CC3 has data terminals D1 to D3, the buffer circuit BUF2 of the core chip CC2 has data terminals D4 to D6, the buffer circuit BUF1 of the core chip CC1 has data terminals D7 to D9, and the buffer circuit BUF0 of the core chip CC0 has data terminals D10 to D12. For example, the data terminal D1 is a terminal connected to the penetrating electrode 110 shown in FIG. 5, the data terminal D2 is a terminal connected to the read/write bath RWBS0, and the data terminal D3 is a terminal connected to the penetrating electrode 210.

Among these data terminals D1 to D12, the data terminals D2, D5, D8, and D11 are connected to the respectively-corresponding memory cell array ARY via the amplifier circuits AMP. Moreover, the data terminal D3 and the data terminal D4 are connected to each other via the penetrating electrode TSV, the data terminal D6 and the data terminal D7 are connected via the penetrating electrode TSV, and the data terminal D9 and the data terminal D10 are connected via the penetrating electrode TSV.

The data terminal D1 is connected to either one of the data terminals D2 and D3 in the buffer circuit BUF3, the data terminal D4 is connected to either one of the data terminals D5 and D6 in the buffer circuit BUF2, the data terminal D7 is connected to either one of the data terminals D8 and D9 in the buffer circuit BUF1, and the data terminal D10 is connected to either one of the data terminals D11 and D12 in the buffer circuit BUF0.

Figure 8:
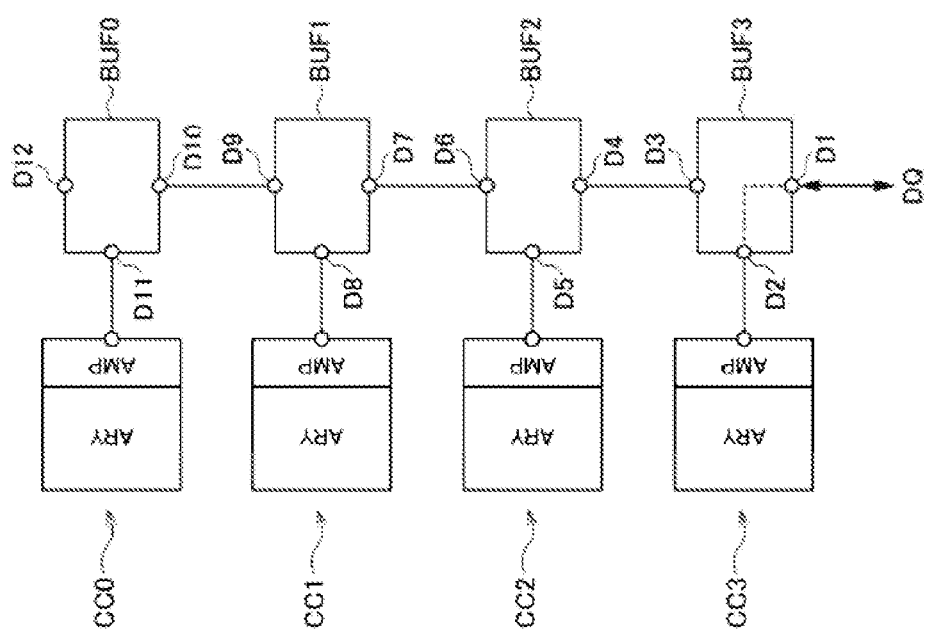
FIG. 8 is a schematic drawing illustrating an operation of buffer circuits BUF in a case in which the core chip CC3 is accessed.

In such a configuration, when the core chip CC3 is accessed from the interface chip IF, as shown in FIG. 8, the data terminals D1 and D2 of the buffer circuit BUF3 are connected to each other. As a result, in a write operation, write data transferred from the interface chip IF is written to the memory cell array ARY of the core chip CC3 via the buffer circuit BUF3. On the other hand, in a read operation, read data read from the memory cell array ARY of the core chip CC3 is output to the interface chip IF via the buffer circuit BUF3.

Figure 9:
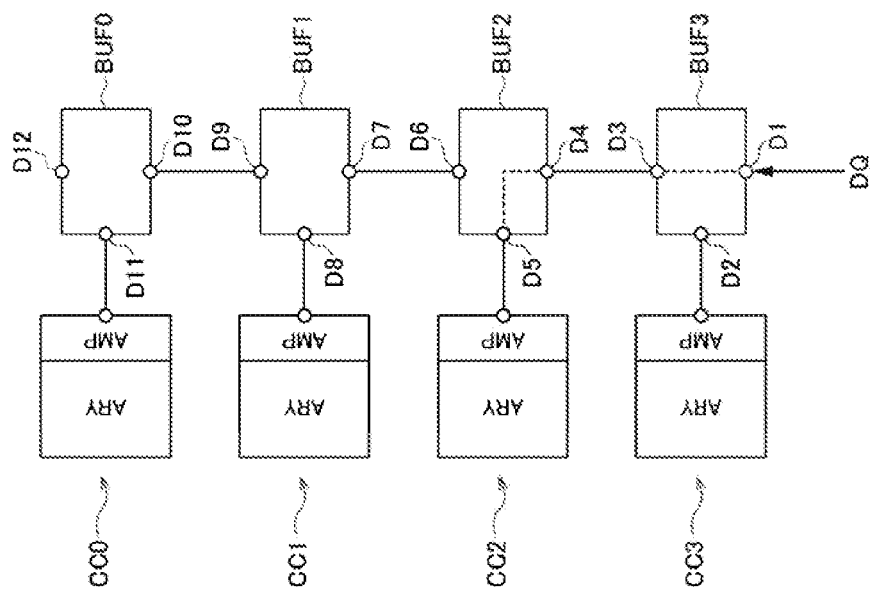
FIG. 9 is a schematic drawing illustrating an operation of the buffer circuits BUF in a case in which the core chip CC2 is accessed.

In a case in which the core chip CC2 is accessed from the interface chip IF, as shown in FIG. 9, the data terminals D1 and D3 of the buffer circuit BUF3 are connected to each other, and the data terminals D4 and D5 of the buffer circuit BUF2 are connected to each other. As a result, in a write operation, write data transferred from the interface chip IF is written to the memory cell array ARY of the core chip CC2 via the buffer circuits BUF3 and BUF2. On the other hand, in a read operation, read data read from the memory cell array ARY of the core chip CC2 is output to the interface chip IF via the buffer circuits BUF2 and BUF3.

Figure 10:
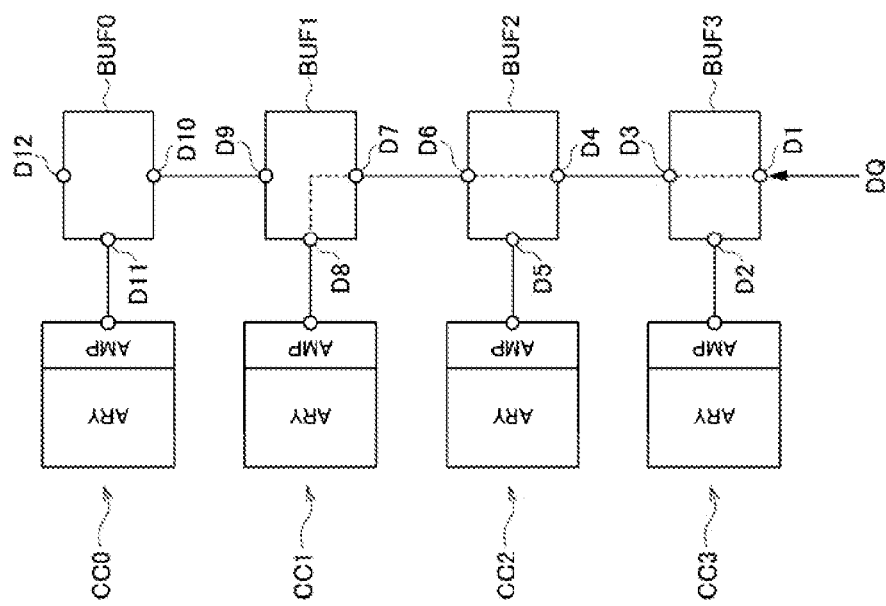
FIG. 10 is a schematic drawing illustrating an operation of the buffer circuits BUF in a case in which the core chip CC1 is accessed.

Furthermore, in a case in which the core chip CC1 is accessed from the interface chip IF, as shown in FIG. 10, the data terminals D1 and D3 of the buffer circuit BUF3 are connected to each other, the data terminals D4 and D6 of the buffer circuit BUF2 are connected to each other, and the data terminals D7 and D8 of the buffer circuit BUF1 are connected to each other. As a result, in a write operation, write data transferred from the interface chip IF is written to the memory cell array ARY of the core chip CC1 via the buffer circuits BUF3, BUF2, and BUF1. On the other hand, in a read operation, read data read from the memory cell array ARY of the core chip CC1 is output to the interface chip IF via the buffer circuits BUF1, BUF2, and BUF3.

Figure 11:
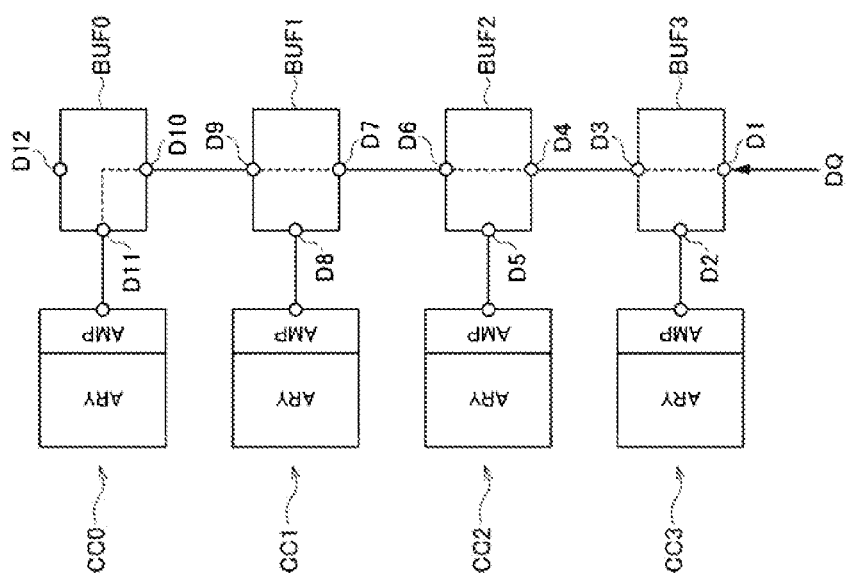
FIG. 11 is a schematic drawing illustrating an operation of the buffer circuits BUF in a case in which the core chip CC0 is accessed.

In a case in which the core chip CC0 is accessed from the interface chip IF, as shown in FIG. 11, the data terminals D1 and D3 of the buffer circuit BUF3 are connected to each other, the data terminals D4 and D6 of the buffer circuit BUF2 are connected to each other, the data terminals D7 and D9 of the buffer circuit BUF1 are connected to each other, and the data terminals D10 and D11 of the buffer circuit BUF0 are connected to each other. As a result, in a write operation, write data transferred from the interface chip IF is written to the memory cell array ARY of the core chip CC0 via the buffer circuits BUF3, BUF2, BUF1, and BUF0. On the other hand, in a read operation, read data read from the memory cell array ARY of the core chip CC0 is output to the interface chip IF via the buffer circuits BUF0, BUF1, BUF2, and BUF3.

Figure 12:
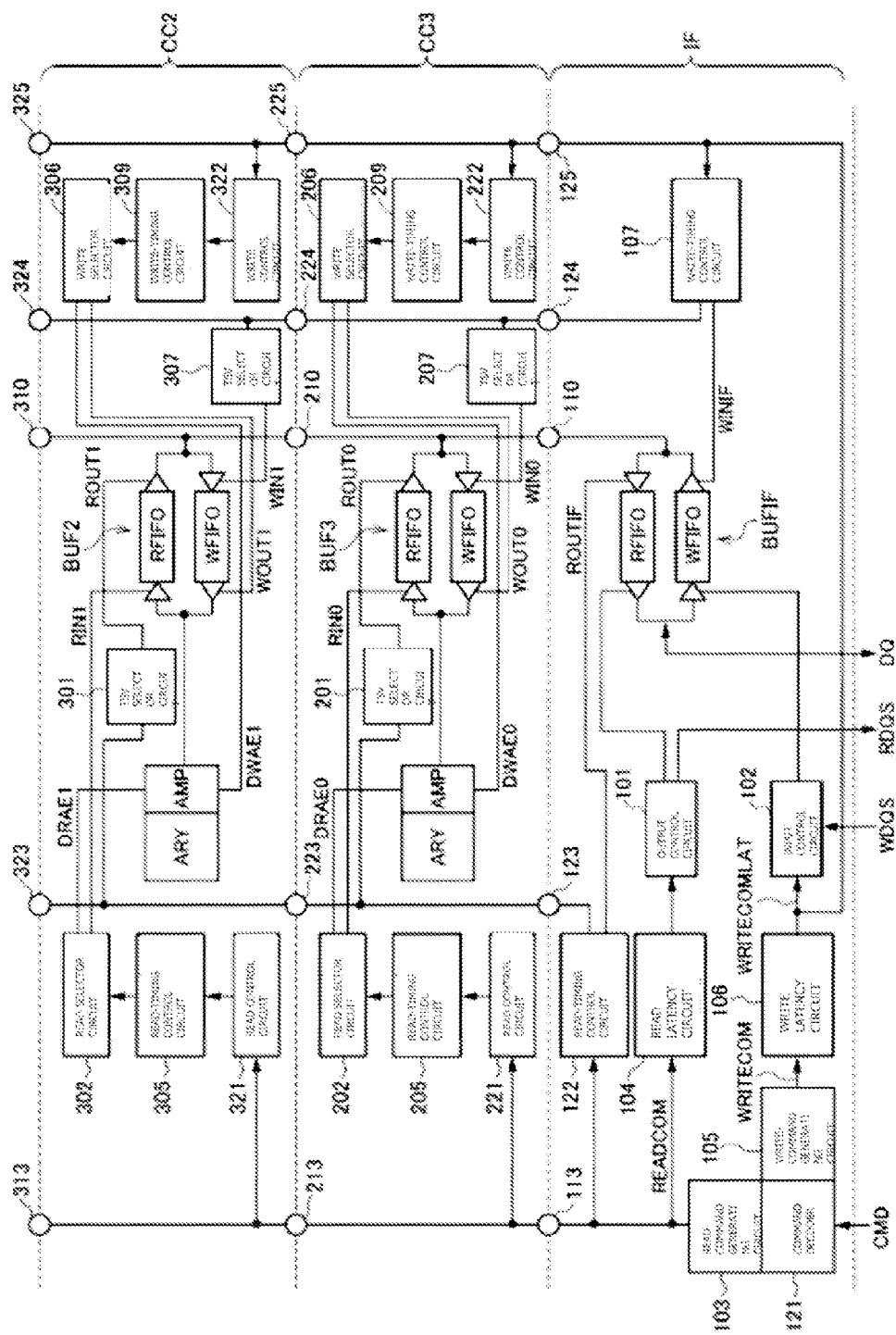
FIG. 12 is a block diagram showing the circuit configuration of an interface chip IF and core chips CC0 to CC3 according to a first prototype.

FIG. 12 is a block diagram showing the circuit configuration of the interface chip IF and the core chips CC0 to CC3 according to a first prototype.

In the first prototype shown in FIG. 12, a signal path for transferring read data and write data is commonly connected to the interface chip IF and the core chips CC0 to CC3. Such a configuration means that the penetrating electrode TSV1 shown in FIG. 2 is used in the signal path.

In the interface chip IF and the core chips CC0 to CC3, the buffer circuits BUFIF and BUF0 to BUF3 are connected in parallel to the signal path. The buffer circuits BUF0 to BUF3 in the core chips CC0 to CC3 are provided with input buffers IB and output buffers OB, and all of the operations thereof are controlled by control circuits in the same core chips CC0 to CC3. All of the operation timing of the control circuits, which control the input buffers IB and the output buffers OB, is controlled by control signals supplied from the interface chip IF.

Moreover, a command decoder 121, a read-timing control circuit 122, and penetrating electrodes 123 to 125 are added to the interface chip IF. Furthermore, read control circuits 221 and 321, write control circuits 222 and 322, and penetrating electrodes 223 to 225 and 323 to 325 are added to the core chips CC.

The read-timing control circuit 122 controls the operations of the TSV selectors 201 and 301 in the core chips CC via the penetrating electrodes 123, 223, and 323. The write-timing control circuit 107 controls the operations of the TSV selectors 207 and 307 in the core chips CC via the penetrating electrodes 124, 224, and 324. Furthermore, a write signal WRITECOMLAT output from the write latency circuit 106 controls the write control circuits 222 and 322 in the core chips CC via the penetrating electrodes 125, 225, and 325.

In such a configuration, the parasitic capacities of the signal path for transferring read data and write data and the signal path for supplying control signals from the interface chip IF to the core chips CC0 to CC3 become large. Therefore, the larger the number of the stacked core chips CC, the timing margin thereof is reduced.

Figure 13:
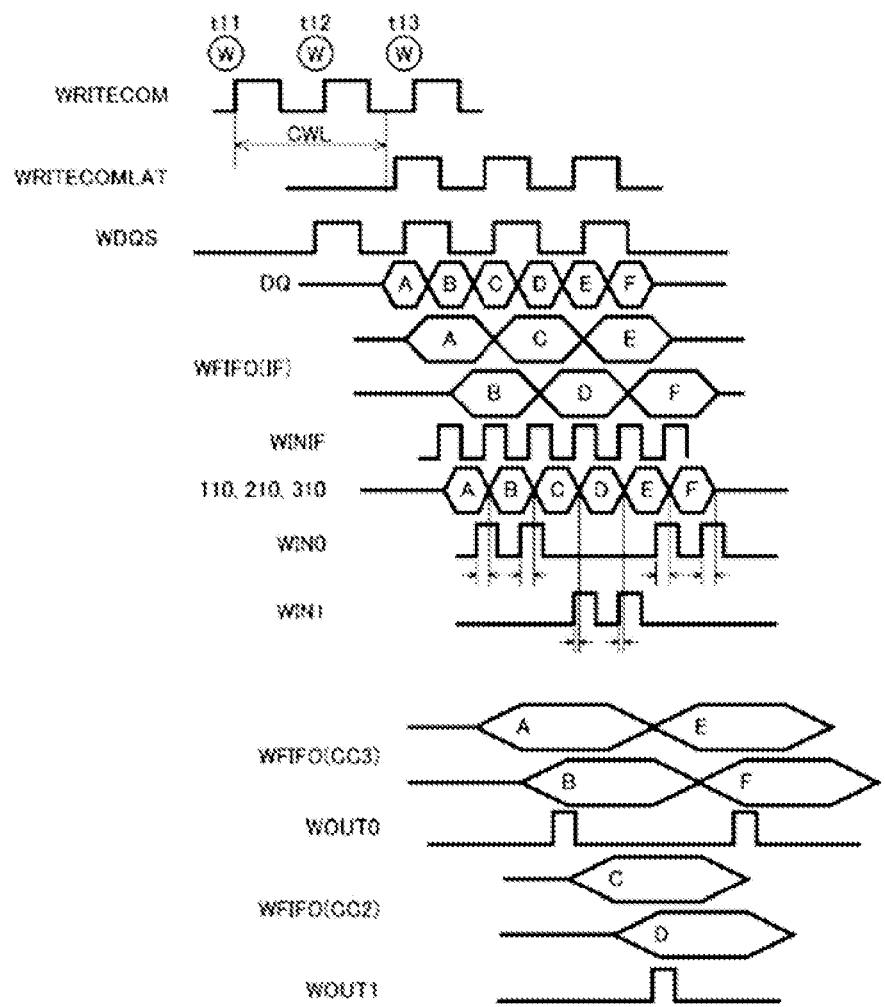
FIG. 13 is a timing chart illustrating a write operation of the semiconductor device according to the first prototype.

FIG. 13 is a timing chart illustrating a write operation of the semiconductor device according to the first prototype.

In the example shown in FIG. 13, as well as the example shown in FIG. 6, write commands (W) are continuously input three times. Among them, the write commands input at the time t11 and t13 are write commands specifying the core chip CC3, and the write command input at the time t12 is a write command specifying the core chip CC2.

In the case of the semiconductor device according to the first prototype, when write data A to F is output from the interface chip IF to the penetrating electrodes 110, 210, and 310, the write data A to F is commonly supplied to all of the core chips CC0 to CC3. Then, the timing signal WIN0 is activated when the write data A, B, E, and F is supplied to the core chips CC0 to CC3, and the timing signal WIN1 is activated when the write data C and D is supplied to the core chips CC0 to CC3. The activation timing of the timing signals WIN0 and WIN1 is controlled by the write-timing control circuit 107, which is provided on the interface chip IF.

As a result, the write data A, B, E, and F is retrieved to the write buffer circuit WFIFO of the core chip CC3, and the write data C and D is retrieved to the write buffer circuit WFIFO of the core chip CC2.

If the write data A and B is retrieved to the write buffer circuit WFIFO of the core chip CC3, the timing signal WOUT0 is activated. As a result, the write data A and B is parallelly supplied to the amplifier circuit AMP and is written to the memory cell array ARY of the core chip CC3.

When the write data C and D is retrieved to the write buffer circuit WFIFO of the core chip CC2, the timing signal WOUT1 is activated. As a result, the write data C and D is parallelly supplied to the amplifier circuit AMP and is written to the memory cell array ARY of the core chip CC2.

Then, when the write data E and F is retrieved to the write buffer circuit WFIFO of the core chip CC3, the timing signal WOUT0 is activated. As a result, the write data E and F is parallelly supplied to the amplifier circuit AMP and is written to the memory cell array ARY of the core chip CC3.

In the above described operation, the timing margins of the timing signals WIN0 and WIN1 are easily reduced. This is for the reasons that, in addition to the large parasitic capacity of the signal path for transferring the write data A to F, the TSV selector circuits 207 and 307 involved in generation of the timing signals WIN0 and WIN1 are commonly connected to the interface chip IF and the core chips CC0 to CC3, and the parasitic capacity of the signal path is also large. Therefore, the timing margin in the write operation becomes small. In the example shown in FIG. 13, it can be understood that the timing margin of the timing signal WIN1 is insufficient compared with that of the timing signal WIN0.

On the other hand, in the semiconductor device 10 according to the above described embodiment, a larger timing margin can be ensured in a write operation.

Figure 14:
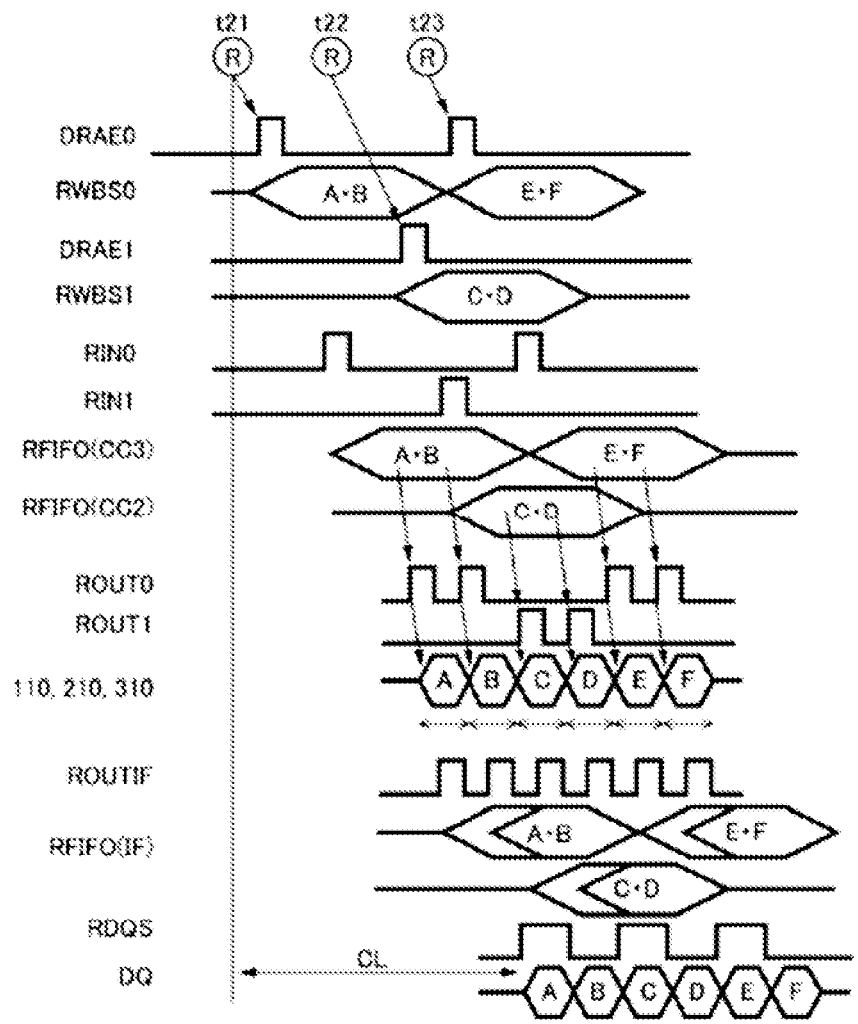
FIG. 14 is a timing chart illustrating a read operation of the semiconductor device according to the first prototype.

FIG. 14 is a timing chart illustrating a read operation of the semiconductor device according to the first prototype.

In the example shown in FIG. 14, as well as the example shown in FIG. 7, read commands (R) are continuously input three times. Among them, the read commands input at the time t21 and t23 are read commands specifying the core chip CC3, and the read command input at the time t22 is a read command specifying the core chip CC2.

First, when the read data A and B is accumulated in the read buffer circuit RFIFO of the core chip CC3, the timing signal ROUT0 is continuously activated two times. As a result, the read data A and B is serially transferred from the core chip CC3 to the interface chip IF.

Then, when the read data C and D is accumulated in the read buffer circuit RFIFO of the core chip CC2, the timing signal ROUT1 is continuously activated two times. As a result, the read data C and D is serially transferred from the core chip CC2 to the interface chip IF.

When the read data E and F is accumulated in the read buffer circuit RFIFO of the core chip CC3, the timing signal ROUT0 is continuously activated two times. As a result, the read data E and F is serially transferred from the core chip CC3 to the interface chip IF.

In the above described operation, the window widths of the read data A to F which reaches the interface chip IF are easily varied. This is for the reasons that, in addition to the large parasitic capacity of the signal path for transferring the read data A to F, the TSV selector circuit 201 involved in generation of the timing signals ROUT0 and ROUT1 is commonly connected to the interface chip IF and the core chips CC0 to CC3, and the parasitic capacity of the signal path is also large. Therefore, the window widths of the read data are varied. In the example shown in FIG. 14, it can be understood that the read data D and the read data E is partially overlapped with each other and that the window widths thereof in this part is reduced.

On the other hand, in the semiconductor device 10 according to the above described present embodiment, also in a read operation, larger window widths can be ensured.

As described above, in the semiconductor device 10 according to the present embodiment, in a write operation, write data is sequentially transferred from the core chip in the lower layer, and the retrieving timing of write data in a certain core chip is controlled by the core chip (or the interface chip IF) in the layer immediately therebelow. Moreover, in a read operation, read data is sequentially transferred from the core chip in the upper layer, and the retrieving timing of the read data in a certain core chip is controlled by the core chip in the layer immediately thereabove. Moreover, the parasitic capacities of the penetrating electrodes used in transfer of read data and write data are also small. By virtue of these, even when read data or write data is transferred at high speed, sufficient timing margins and window widths of data can be ensured.

Figure 15:
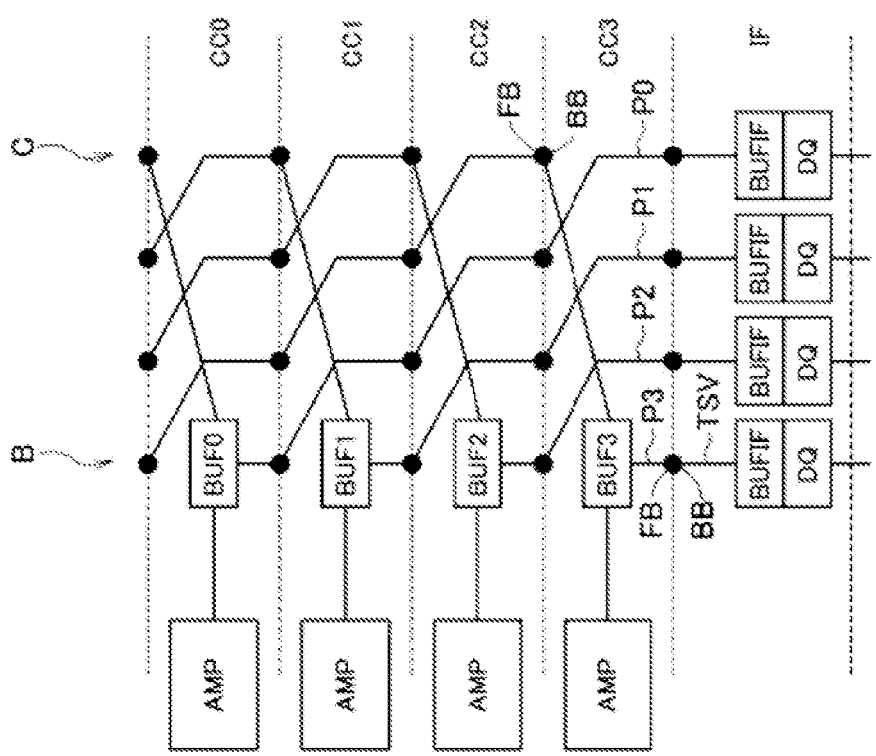
FIG. 15 is a schematic drawing illustrating the relations of connections of signal paths corresponding to 4 bits in the semiconductor device 10.

FIG. 15 is a schematic drawing illustrating the relations of connections of the signal paths corresponding to 4 bits in the semiconductor device 10.

In the example shown in FIG. 15, the signal paths for transferring read data and write data are in so-called spiral connection. Therefore, these signal paths P0 to P3 corresponding to 4 bits are allocated to the mutually different core chips CC0 to CC3. In the core chips CC0 to CC3, the buffer circuits BUF0 to BUF3 are inserted between the front-surface bumps FB provided at a planar position shown by a symbol B and the back-surface bumps BB shown by a symbol C.

According to such a configuration, the parasitic capacity of each of the signal paths P0 to P3 is slightly different; however, since the different signal path is allocated to each of the core chips CC0 to CC3, during data transfer to a certain core chip CC, data transfer to another core chip CC can be executed in parallel.

Figure 16:
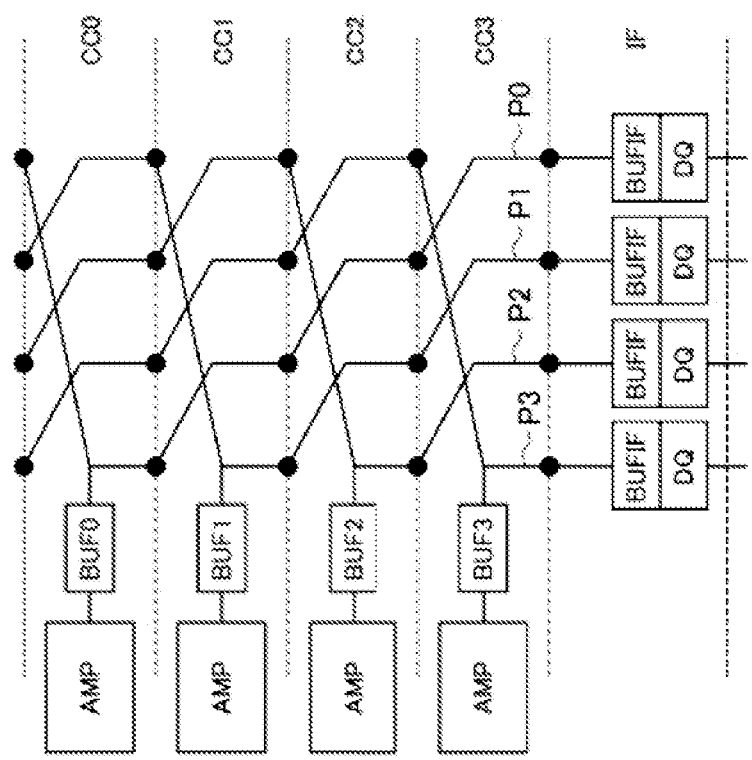
FIG. 16 is a schematic drawing illustrating the relations of connections of signal paths corresponding to 4 bits in a semiconductor device according to a second prototype.

FIG. 16 is a schematic drawing illustrating the relations of connections of the signal paths corresponding to 4 bits in a semiconductor device according to a second prototype.

Also in the example shown in FIG. 16, the signal paths P0 to P3 are in so-called spiral connection, but it has a configuration in which the buffer circuits BUF0 to BUF3 are connected without being inserted in the signal paths P0 to P3. In such a configuration, the signal paths P1 to P3 are also connected to the core chips CC, which are irrelevant to the signal paths, the parasitic capacities thereof are increased.

On the other hand, according to the connection relation shown in FIG. 11, the signal paths P1 to P3 are not connected to the core chips CC, which are irrelevant to the signal paths. Therefore, the parasitic capacities thereof can be reduced.

Figure 17:
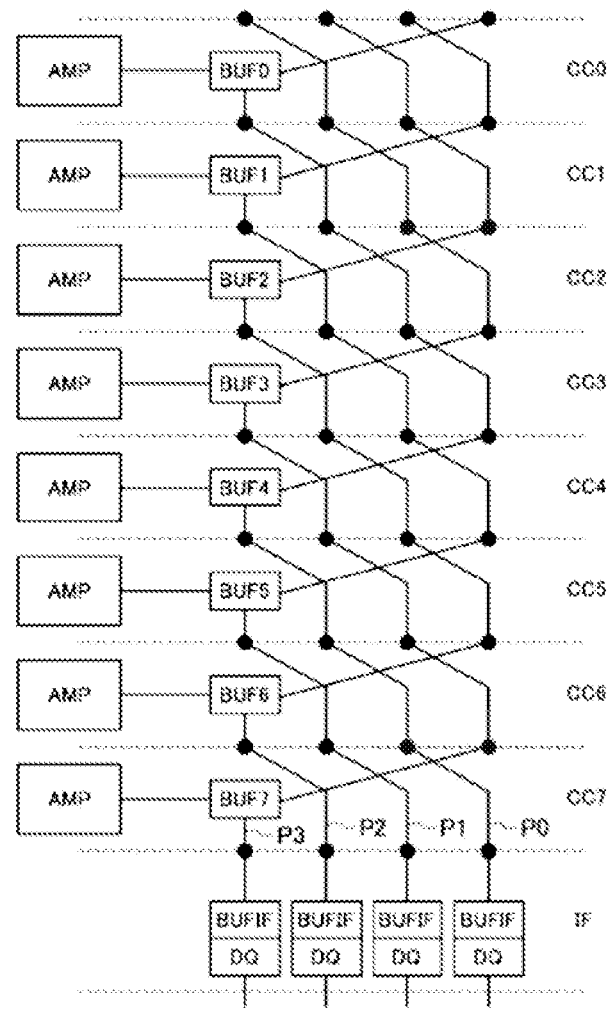
FIG. 17 is a schematic drawing illustrating the relations of connections of signal paths corresponding to 4 bits in a case in which eight core chips CC0 to CC7 are stacked.

FIG. 17 is a schematic drawing illustrating the relations of connections of signal paths corresponding to 4 bits in a case in which eight core chips CC0 to CC7 are stacked.

Also in the example shown in FIG. 17, the signal paths for transferring read data and write data are in spiral connection. The signal path P0 is allocated to the core chips CC0 and CC4, the signal path P1 is allocated to the core chips CC1 and CC5, the signal path P2 is allocated to the core chips CC2 and CC6, and the signal path P3 is allocated to the core chips CC3 and CC7. Therefore, each of the signal paths P0 to P3 corresponding to 4 bits is allocated to two core chips CC. In the core chips CC0 to CC7, buffer circuits BUF0 to BUF7 are inserted between the front-surface bumps FB provided at a planar position shown by a symbol B and the back-surface bumps BB shown by a symbol C.

Figure 18:
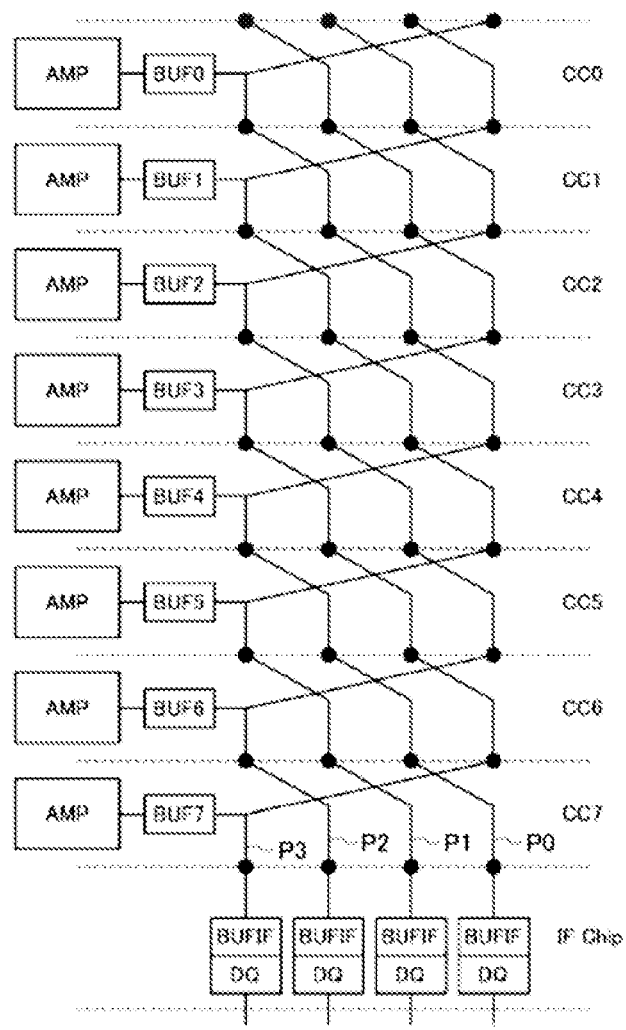
FIG. 18 is a schematic drawing illustrating the relations of connections of signal paths corresponding to 4 bits in a semiconductor device according to a third prototype.

FIG. 18 is a schematic drawing illustrating the relations of connections of signal paths corresponding to 4 bits in a semiconductor device according to a third prototype.

Also in the example shown in FIG. 18, the signal paths P0 to P3 are in so-called spiral connection, but has a configuration in which the buffer circuits BUF0 to BUF7 are connected without being inserted in the signal paths P0 to P3, which is different from the example shown in FIG. 17. In the case of such a configuration, the signal paths P1 to P3 are connected also to the core chips CC which are irrelevant to the signal paths; therefore, the parasitic capacities thereof are increased.

On the other hand, according to the configuration shown in FIG. 18, although the number of the stacked core chips CC is large, the parasitic capacities of the signal paths P0 to P3 can be suppressed.

Figure 19:
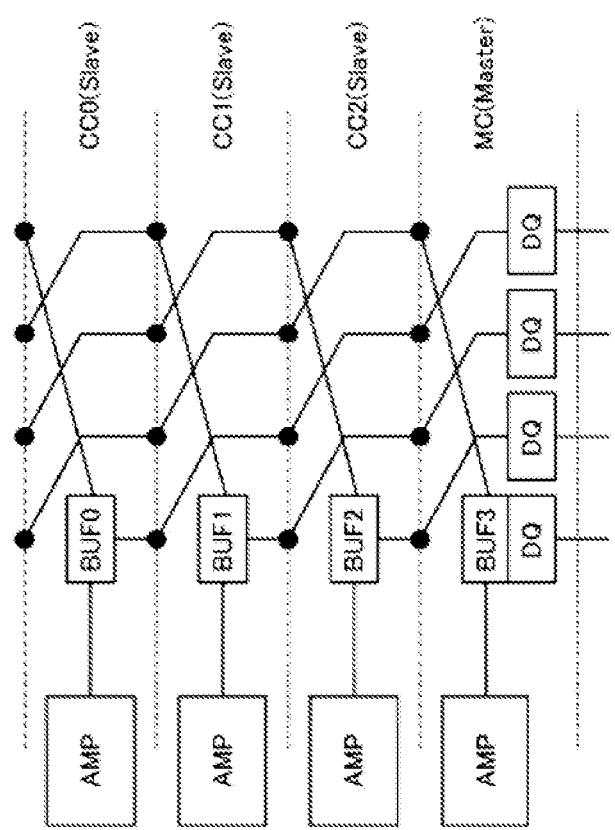
FIG. 19 is a schematic drawing illustrating a modification example of the semiconductor device shown in FIG. 15.
Figure 20:
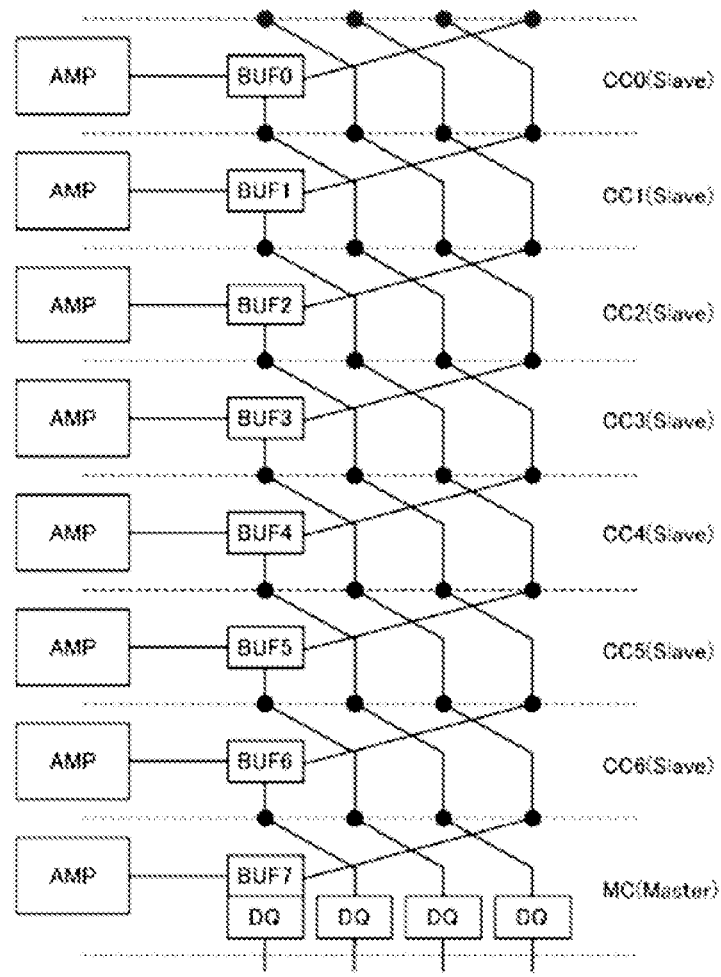
FIG. 20 is a schematic drawing illustrating a modification example of the semiconductor device shown in FIG. 17.

FIG. 19 is a schematic drawing illustrating a modification example of the semiconductor device shown in FIG. 15, and FIG. 20 is a schematic drawing illustrating a modification example of the semiconductor device shown in FIG. 17.

The modification examples shown in FIG. 19 and FIG. 20 have a configuration in which the interface chip IF and the core chip CC3 or CC7 of the lowermost layer are integrated in a single master chip MC. The master chip MC is provided with both of the functions of the interface chip IF and the core chip CC and plays the role of controlling the other core chips CC (or slave chips). According to such a configuration, a stacked-type semiconductor device can be formed with a smaller number of chips.

Figure 21:
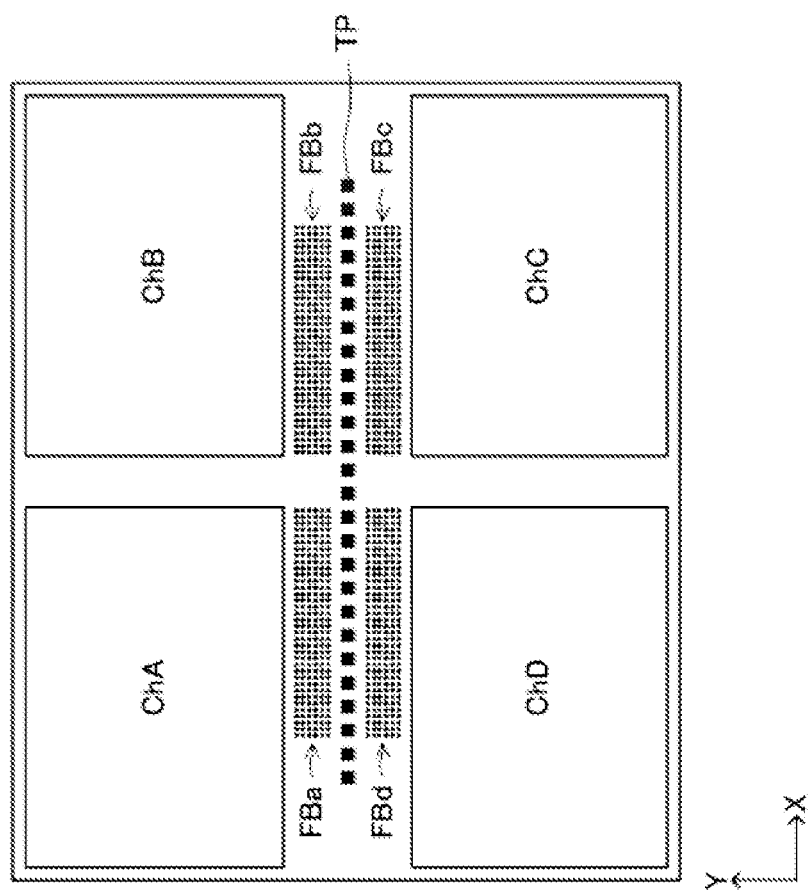
FIG. 21 is a plan view illustrating the configuration of a wide I/O-type DRAM.

FIG. 21 is a planar view illustrating the configuration of a so-called wide I/O-type DRAM.

The wide I/O-type DRAM shown in FIG. 21 has four channels ChA to ChD disposed in a matrix in an X-direction and a Y-direction. Each of the channels ChA to ChD is a circuit block which can be operated as a single DRAM. Therefore, it has a configuration in which four independent DRAMs are formed into a single chip.

In some embodiments, instead of the core chips CC0 to CC3 shown in FIG. 1, such wide I/O-type DRAMs can be also used. In that case, instead of the interface chip IF, a control chip which controls the wide I/O-type DRAMs can be used.

A plurality of front-surface bumps FB are provided on a principal surface of the wide I/O-type DRAM, and penetrating electrodes TSV are provided therebelow. Each of these front-surface bumps FB is corresponding to any of channels ChA to ChD. In FIG. 21, the front-surface bumps FB corresponding to the channels ChA to ChD are described as front-surface bumps FBa to FBd. The number of the front-surface bumps FB for data which are allocated to each of the channels ChA to ChD is, for example, 128, which is extremely large, and the number of the required front-surface bumps FB for power supply, etc. is large for each channel. Therefore, for example, about 300 front-surface bumps FB are provided for each of the channels ChA to ChD. Therefore, in the whole chip, more than 1000 front-surface bumps FB are used.

The front-surface bumps FB include test terminals called direct access terminals. However, since the size of the front-surface bumps FB is extremely small, it is difficult to bring a probe of a tester into contact with the direct access terminal. Therefore, test pads TP for contact with a probe of a tester are allocated to the direct access terminals, respectively. The test pad TP has a planar size that is larger than the front-surface bump FB, and, by virtue of that, the probe of the tester can be brought into contact therewith.

Figure 22:
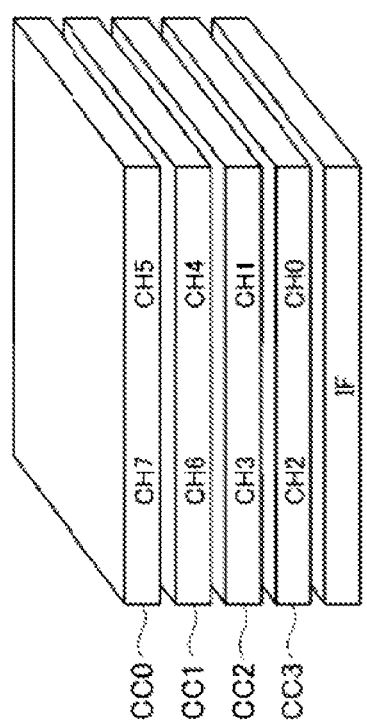
FIG. 22 is a drawing showing an example in which the core chips CC0 to CC3 have a 2-channel configuration.

FIG. 22 is a drawing showing an example in which the core chips CC0 to CC3 have a 2-channel configuration.

In the example shown in FIG. 22, channels CH5 and CH7 are allocated to the core chip CC0, channels CH4 and CH6 are allocated to the core chip CC1, channels CH1 and CH3 are allocated to the core chip CC2, and channels CH0 and CH2 are allocated to the core chip CC3. If the signal paths of read data and write data are in spiral connection like that shown in FIG. 15, the channels CH0 to CH7 can be operated in parallel. Embodiments of the present invention can be also applied to a semiconductor device of this type.

Figure 23:
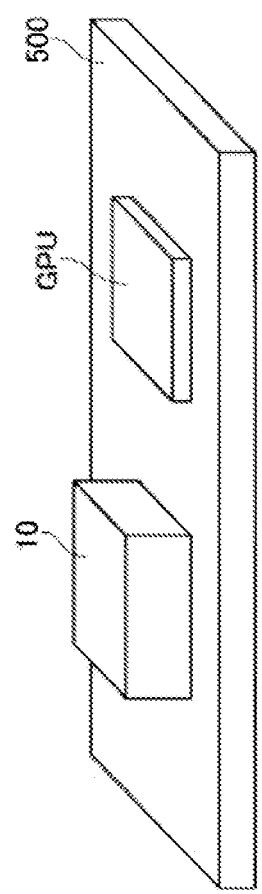
FIG. 23 is a schematic drawing showing a first example of an information processing system provided with the semiconductor device 10.

FIG. 23 is a schematic drawing showing a first example of an information processing system provided with the semiconductor device 10.

The information processing system shown in FIG. 23 has a configuration in which the above described semiconductor device 10 and a graphic chip GPU are mounted on an interposer 510. The graphic chip GPU is a semiconductor chip, which carries out image processing by using data input/output to/from the semiconductor device 10, and is mounted on a flat surface different from the semiconductor device 10 in the example shown in FIG. 23.

According to such a configuration, the high-speed and high-capacity semiconductor device 10 and the graphic chip GPU can be disposed to be close to each other; therefore, the image processing ability of the graphic chip GP can be utilized without waste. If a stacked body of the above described wide I/O-type DRAM is used instead of the semiconductor device 10, a control chip may be further stacked on the stacked body, or the necessity of providing the control chip is eliminated if the graphic chip GPU is provided with the function of the control chip.

FIG. 24 is a schematic drawing showing a second example of the information processing system provided with the semiconductor device 10.

The information processing system shown in FIG. 24 has a configuration in which the semiconductor device 10 and the graphic chip GPU are stacked. According to the configuration, the connection between the high-speed and high-capacity semiconductor device 10 and the graphic chip GPU can be shortened the most. Therefore, even when a graphic chip GPU of a higher speed is used, the image processing ability thereof can be utilized without waste. In a case in which a stacked body of the above described wide I/O-type DRAM is used instead of the semiconductor device 10, a control chip may be further stacked on the stacked body, or the necessity of providing a control chip is eliminated if the graphic chip GPU is provided with the function of the control chip.

FIG. 25 is a schematic drawing showing a third example of the information processing system provided with the semiconductor device 10.

The information processing system shown in FIG. 25 has a configuration in which the semiconductor device 10 and a processor chip CPU are mounted on a circuit board 520. The processor chip CPU is a semiconductor chip which executes programs input/output to/from the semiconductor device 10 and is mounted on a flat surface different from the semiconductor device 10 in the example shown in FIG. 25. However, it is also possible to stack the semiconductor device 10 and the processor chip CPU.

According to the configuration, the high-speed and high-capacity semiconductor device 10 and the processor chip CPU can be disposed to be close to each other. Therefore, the program processing ability of the processor chip CPU can be utilized without waste. In a case in which a stacked body of the above-described wide I/O-type DRAM is used instead of the semiconductor device 10, a control chip may be further stacked on the stacked body, or the necessity of providing a control chip is eliminated if the processor chip CPU is provided with the function of the control chip.

Various embodiments of the present invention have been described above. However, the present invention is not limited to the above described embodiments, various changes can be made within a range not departing from the gist of the present invention, and it goes without saying that they are also included in the range of the present invention.

What is claimed is:

1. A semiconductor device comprising:
    first, second, third and fourth chips stacked in this order, each of the first, second, third and fourth chips including first, second, third and fourth terminals formed above a first surface thereof, a memory cell array, and a first in first out (FIFO) circuit;
    wherein each of the first, second and third chips includes fifth, sixth, seventh and eighth terminals formed above a second surface opposite to the first surface, the FIFO circuit coupled in series between the first terminal and the eighth terminal, the second terminal coupled to the fifth terminal, the third terminal coupled to the sixth terminal and the fourth terminal coupled to the seventh terminal.

2. The semiconductor device as claimed in claim 1, wherein each of the first, second and third chips includes first, second, third and fourth through substrate vias (TSVs) that penetrate a substrate, wherein the first terminal and the eighth terminal are coupled via the first TSV and the FIFO circuit, the second terminal and the fifth terminal are coupled via the second TSV, the third terminal and the sixth terminal are coupled via the third TSV and the fourth terminal and the seventh terminal are coupled via the fourth TSV.

3. The semiconductor device as claimed in claim 1, wherein each of the first, second and third chips includes a first signal path formed between the second terminal and the fifth terminal being free from a FIFO circuit, a second signal path formed between the third terminal and sixth terminal being free from a FIFO circuit, and a third signal path formed between the fourth terminal and the seventh terminal being free from a FIFO circuit.

4. The semiconductor device as claimed in claim 1, wherein the FIFO circuit includes a writing FIFO circuit configured to receive data on the first terminal, and a reading FIFO circuit configured to output data to the first terminal.

5. The semiconductor device as claimed in claim 4, wherein each of the first, second and third chips includes a first selecting circuit configured to provide an output of the writing FIFO circuit to one of the eighth terminal and the memory cell array.

6. The semiconductor device as claimed in claim 5, wherein each of the first, second and third chips includes a second selecting circuit configured to provide one of data on the eighth terminal or data read from the memory cell array to the reading FIFO circuit.

7. The semiconductor device as claimed in claim 1, wherein each of the first, second, third and fourth chips includes first and second control terminals formed above the first terminal, wherein the FIFO circuit is configured to receive data from the first terminal responsive to a first control signal above the first control terminal, and output data to the first terminal responsive to a second control signal on the second control terminal.

8. The semiconductor device as claimed in claim 1, wherein each of the first, second and third chips includes
    a first command terminal formed on the first surface,
    a second command terminal formed on the second surface,
    a command TSV coupled between the first and second command terminals, and
    a command circuit coupled to the first and second terminals.

9. A semiconductor device comprising:
    a first terminal formed above a first surface of a semiconductor substrate;
    a second terminal formed above a second surface of the semiconductor substrate opposite to the first surface;
    a first through substrate via (TSV) penetrating the semiconductor substrate; and
    a first-in first-out (FIFO) circuit;
    wherein the first TSV and the FIFO circuit are coupled in series between the first terminal and the second terminal.

10. The semiconductor device as claimed in claim 9, further comprising:
    a third terminal formed above the first surface;
    a fourth terminal formed above the second surface; and
    a second TSV penetrating the substrate;
    wherein the third terminal and the fourth terminal are coupled to one another via the second TSV without a FIFO circuit.

11. The semiconductor device as claimed in claim 9, wherein the FIFO circuit includes a writing FIFO circuit configured to receive data on the first terminal, and a reading FIFO circuit configured to output data to the first terminal.

12. The semiconductor device as claimed in claim 11, further comprising a memory cell array and a first selection circuit, the first selection circuit configured to selectively provide an output from the writing FIFO circuit to one of the third terminal and the memory cell array.

13. The semiconductor device as claimed in claim 12, further comprising a second selection circuit configured to selectively provide one of data on the third terminal and data read from the memory cell array to the reading FIFO circuit.

14. The semiconductor device as claimed in claim 9, wherein each of the first and second terminals is a data input output terminal to input and output a data.

15. The semiconductor device as claimed in claim 9, further comprising
a first and second control terminals formed above the first surface,
wherein the FIFO circuit is configured to receive data from the first terminal responsive to a first control signal on the first control terminal, and output data to the first terminal responsive to a second control signal on the second control terminal.

16. The semiconductor device as claimed in claim 9, further comprising
a first command terminal formed above the first surface,
a second command terminal formed above the second surface,
a command TSV coupled between the first and second command terminals, and
a command circuit coupled to the first and second terminals.

* * * * *